(12) United States Patent
Ohtsuka et al.

(10) Patent No.: US 6,992,005 B2
(45) Date of Patent: Jan. 31, 2006

(54) SEMICONDUCTOR DEVICE AND METHOD OF MANUFACTURING THE SAME

(75) Inventors: Nobuyuki Ohtsuka, Kawasaki (JP); Noriyoshi Shimizu, Kawasaki (JP); Hisaya Sakai, Kawasaki (JP); Yoshiyuki Nakao, Kawasaki (JP); Hiroki Kondo, Kawasaki (JP); Takashi Suzuki, Kawasaki (JP)

(73) Assignee: Fujitsu Limited, Kawasaki (JP)

(*) Notice: Subject to any disclaimer, the term of this patent is extended or adjusted under 35 U.S.C. 154(b) by 36 days.

(21) Appl. No.: 10/819,231

(22) Filed: Apr. 7, 2004

(65) Prior Publication Data

US 2004/0188839 A1 Sep. 30, 2004

Related U.S. Application Data

(62) Division of application No. 10/127,418, filed on Apr. 23, 2002, now Pat. No. 6,750,541.

(30) Foreign Application Priority Data

Apr. 27, 2001 (JP) ............................. 2001-130694
Feb. 20, 2002 (JP) ............................... 2002-43117

(51) Int. Cl.
    *H01L 29/72* (2006.01)

(52) U.S. Cl. ..................... 438/685; 438/653; 438/655; 438/656; 438/675; 438/687

(58) Field of Classification Search ................ 257/758; 438/612, 613, 614, 633, 644, 685
See application file for complete search history.

(56) References Cited

U.S. PATENT DOCUMENTS

| | | | |
|---|---|---|---|
| 5,426,330 A | 6/1995 | Joshi et al. .................. 257/752 |
| 5,470,789 A | 11/1995 | Misawa ...................... 437/190 |
| 5,693,563 A | 12/1997 | Teong ......................... 257/758 |
| 6,339,025 B1 | 1/2002 | Liu et al. .................... 438/687 |
| 6,342,444 B1 | 1/2002 | Higashi et al. ............. 438/627 |
| 6,355,559 B1 * | 3/2002 | Havemann et al. ......... 438/643 |
| 2004/0021226 A1 * | 2/2004 | Geffken et al. ............. 257/758 |

FOREIGN PATENT DOCUMENTS

| | | |
|---|---|---|
| EP | 1 083 596 A1 | 3/2001 |
| JP | 5-129224 | 5/1993 |

* cited by examiner

*Primary Examiner*—Edward Wojciechowicz
(74) *Attorney, Agent, or Firm*—Westerman, Hattori, Daniels & Adrian, LLP

(57) ABSTRACT

A semiconductor device having a multi-layered wiring structure containing a copper layer, comprises a first insulating film formed over a semiconductor substrate, a first copper pattern buried in the first insulating film, a cap layer formed on the first copper pattern and the first insulating film and made of a substance a portion of which formed on the first copper pattern has a smaller electrical resistance value than a portion formed on the first insulating film, second insulating films formed on the cap layer, and a second copper pattern buried in a hole or a trench, which is formed in the second insulating films on the first copper pattern; and connected electrically to the first copper pattern via the cap layer.

14 Claims, 20 Drawing Sheets

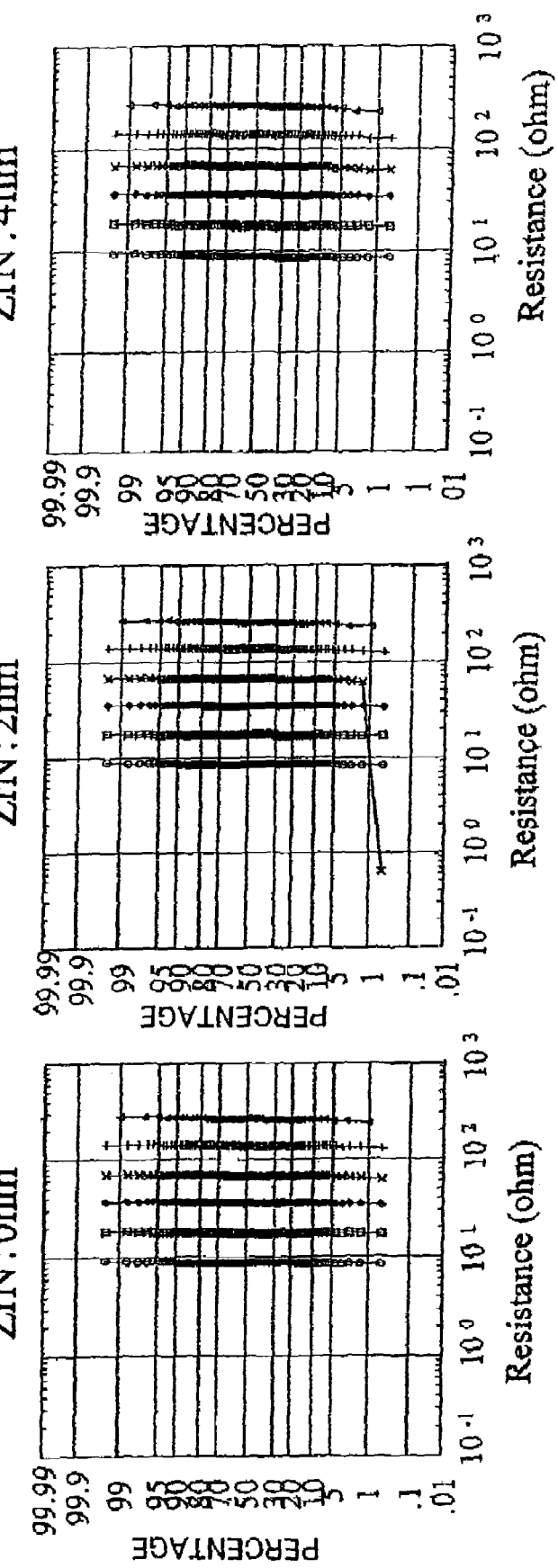
FIG. 8A  ZrN: 0nm
FIG. 8B  ZrN: 2nm
FIG. 8C  ZrN: 4nm

SEMICONDUCTOR DEVICE AND METHOD OF MANUFACTURING THE SAME

CROSS-REFERENCE TO RELATED APPLICATIONS

This application is a divisional application of prior application Ser. No. 10/127,418 filed Apr. 23, 2002 U.S. Pat. No. 6,750,541.

This application is based upon and claims priority of Japanese Patent Applications No. 2001-130694, filed in Apr. 27, 2001, and No. 2002-43117, filed in Feb. 20, 2002, the contents being incorporated herein by reference.

BACKGROUND OF THE INVENTION

1. Field of the Invention

The present invention relates to a semiconductor device and a method of manufacturing the same and, more particularly, a semiconductor device having a multi-layered wiring structure containing a copper layer wiring and a method of manufacturing the same.

2. Description of the Prior Art

Various semiconductor elements are miniaturized more and more with the progress of the process technology of the semiconductor integrated circuit (LSI). Also, the high density, the increase in layer number, and the reduction in thickness of the wirings in the LSI are making rapid progress, and thus the stress applied to the wirings and the density of the current flowing through the wirings are steadily increased respectively. Accordingly, when the current of the high density flows through the wirings, for example, the breaking phenomenon of the wiring that is called the electromigration (EM) is ready to occur. It is supposed that, the driving force of the electromigration is generated when metallic atoms are moved and diffused owing to the collision of the high-density electron flows. Since the degradation phenomenon by the electromigration becomes still more intense with the miniaturization of the element, the development of the wiring material and the wiring structure, through which the high-density current can be passed and which can achieve the high reliability, is required.

As the wiring in which the electromigration is hard to occur rather than the aluminum wiring, there is the copper wiring.

However, the fine patterning of the copper layer is difficult. As one of the effective approaches for manufacturing the copper wiring, the damascene method that has the steps of forming previously the wiring trench in the insulating film and then burying the copper layer therein is put to practical use. Also, the dual-damascene method that forms simultaneously the via and the wiring by forming the via hole under the wiring trench is known.

Then, an example of steps of forming the via by the damascene method is shown in FIGS. 1A to 1D hereunder.

First, as shown in FIG. 1A, an interlayer insulating film 102 is formed on a semiconductor substrate 101, and a first silicon oxide film 103 and a silicon nitride film 107 are formed on the interlayer insulating film 102. Then, a first wiring trench 104 is formed in these films 103, 107 by patterning the first silicon oxide film 103 and the silicon nitride film 107. Then, a barrier metal layer 105 and a first copper layer 106 are formed sequentially in the first wiring trench 104 and on the silicon nitride film 107 to bury the first wiring trench 104 completely. Then, the first copper layer 106 and the barrier metal layer 105 are polished by the chemical mechanical polishing (CMP) method and removed from the upper surface of the silicon nitride film 107.

Accordingly, as shown in FIG. 1B, the first copper layer 106 left only in the first wiring trench 104 is used as a copper wiring 106a. Then, a second silicon oxide film 108 is formed on the silicon nitride film 107 and the copper wiring 106a respectively.

Then, as shown in FIG. 1C, a via hole 109 is formed on the copper wiring 106a by patterning the second silicon oxide film 108.

Then, as shown in FIG. 1D, a second barrier metal layer 110 and a second copper layer 111 are formed in the via hole 109 and on the second silicon oxide film 108. Then, the second copper layer 111 and the second barrier metal layer 110 are polished by the CMP method and removed from the upper surface of the second silicon oxide film 108. Then, the second copper layer 111 left in the via hole 109 is used as a via 111a.

The multi-layered copper wiring structure can be obtained by repeating the formation of the copper wiring and the formation of the via in compliance with above steps.

By the way, as shown in FIG. 1C, if the via hole 109 is formed in the second silicon oxide film 108, the copper wiring 106a is exposed from the via hole 109 and exposed directly to the outside air.

As a result, it is possible that the copper wiring 106a is contaminated, corroded and oxidized and thus the defective connection between the copper wiring 106a and the via 111a is caused. As its measure, the process of cleaning the copper wiring 106a from the via hole 109 is carried out. In this case, if the aspect ratio of the via hole 109 is increased, it becomes difficult to clean completely the surface of the copper wiring 106a.

SUMMARY OF THE INVENTION

It is an object of the present invention to provide a semiconductor device that is capable of preventing the surface oxidation/corrosion of metal patterns used as the copper wiring or the via and a method of manufacturing the same.

According to the present invention, the cap layer made of the substance with which the electrical resistance on the first metal pattern film becomes smaller than the electrical resistance on the insulating film is formed on the first insulating film and the first metal pattern. The metal pattern is the copper wiring or the copper via, for example.

As the material of such cap layer, there are the zirconium nitride that is chemically stable, its compound, etc. It is preferable that the film thickness should be set to less than 20 nm.

Therefore, when the hole or the trench is formed on the first metal pattern and in the second insulating film formed on the first insulating film, the oxidation, the corrosion, and the contamination of the first metal pattern under the hole or the trench are prevented by the cap layer.

In addition, the second metal pattern formed in the hole or the trench is connected electrically to the first metal pattern via the cap layer. While, since the cap layer acts as the insulating portion on the first insulating film, the patterning of the cap layer can be omitted.

The zirconium, the titanium, the hafnium, the zirconium nitride, or any one of their compounds constituting such cap layer can be selectively etched on the first insulating film by adjusting the etching conditions while leaving on the first metal pattern. As a result, such cap layer may be removed selectively from the upper surface of the first insulating film by the selective etching without the mask, and may be left on the first metal pattern.

If it is intended to prevent surely the copper diffusion from the first metal pattern containing the copper to the insulating film, the second cap layer made of the copper diffusion preventing insulating material may be formed on the cap layer.

BRIEF DESCRIPTION OF THE DRAWINGS

FIGS. 8A to 8C are views showing a relationship between a film thickness of a ZrN cap layer on the copper wiring and a wiring resistance in the semiconductor device according to the embodiment of the present invention respectively.

DETAILED DESCRIPTION OF THE PREFERRED EMBODIMENTS

Embodiments of the present invention will be explained with reference to the accompanying drawings hereinafter.

(First Embodiment)

FIGS. 2A to 2F are sectional views showing steps of manufacturing a semiconductor device according to a first embodiment of the present invention.

Figure 1A:
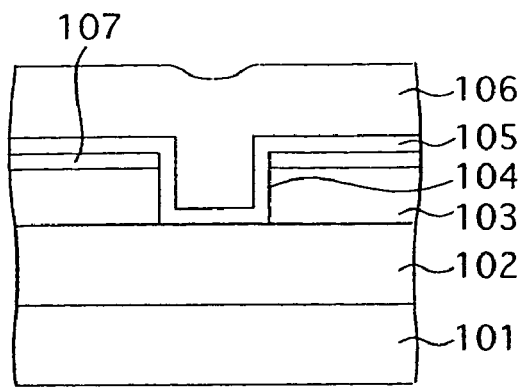
FIGS. 1A to 1D are sectional views showing steps of forming the multi-layered copper wiring structure in the prior art.
Figure 1B:
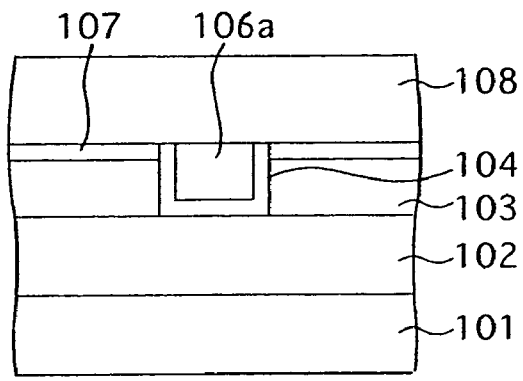
Figure 1C:
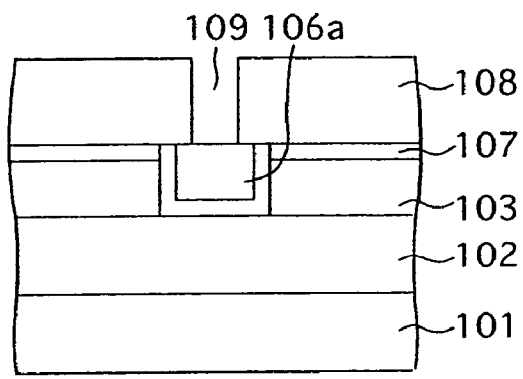
Figure 1D:
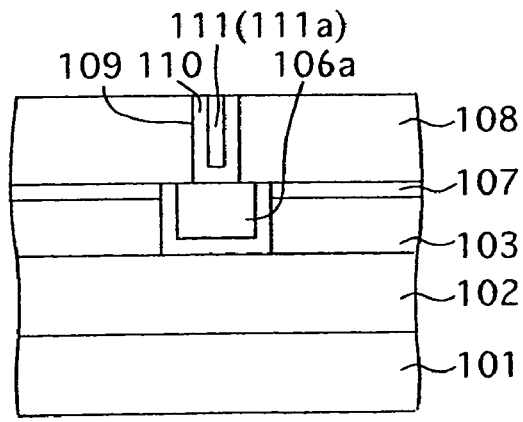
Figure 2A:
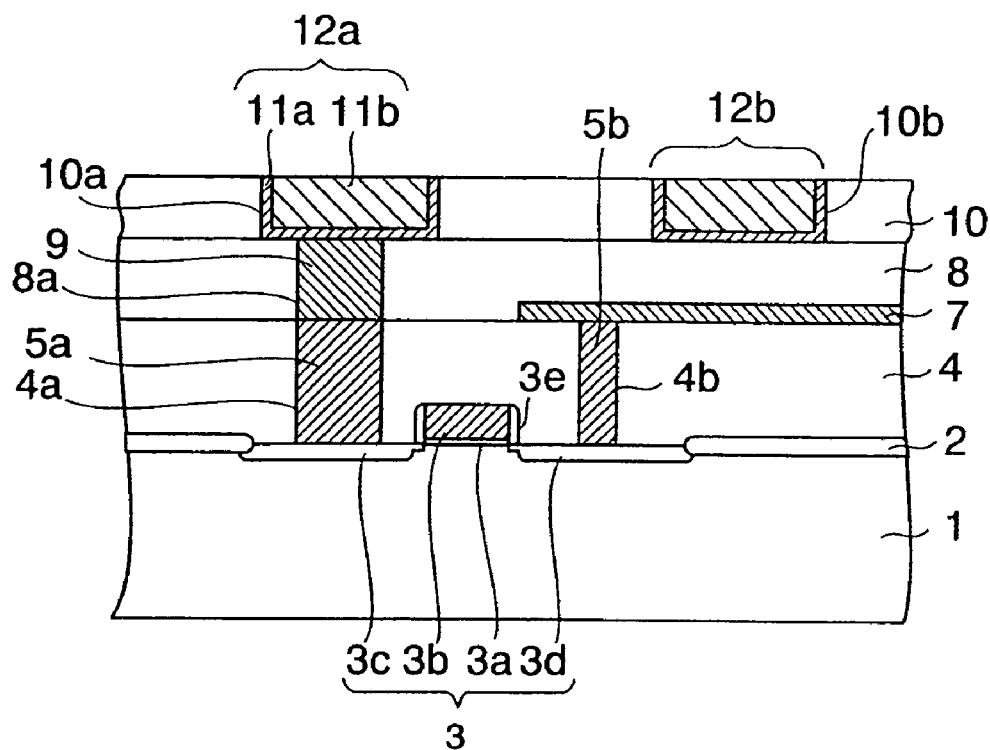
FIGS. 2A to 2F are sectional views showing a semiconductor device manufacturing method according to a first embodiment of the present invention.
Figure 2B:
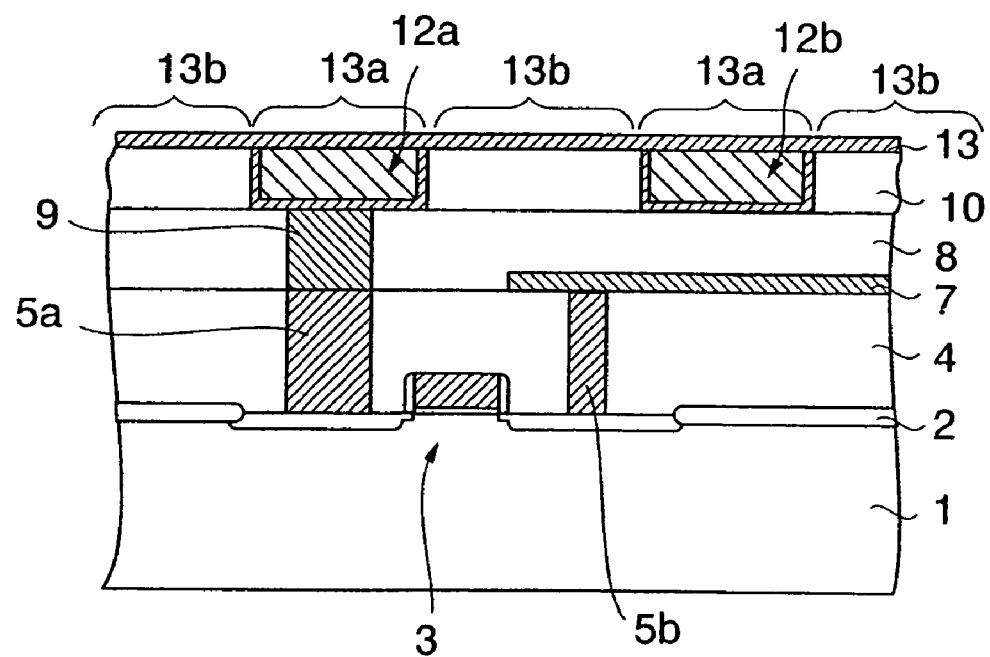

First, a structure shown in FIG. 2A will be explained hereunder.

An element isolation insulating layer 2 is formed on a p-type silicon (semiconductor) substrate 1 to surround an active element region. A MOS transistor 3 is formed in the active element region. The MOS transistor 3 has a gate electrode 3b that is formed on the silicon substrate 1 by way of a gate insulating film 3a, and first and second n-type impurity diffusion layers 3c, 3d that are formed on the silicon substrate 1 on both sides of the gate electrode 3b respectively to have the LDD structure. Also, an insulating sidewall 3e is formed on both side surfaces of the gate electrode 3b.

A first interlayer insulating film 4 made of $SiO_2$ is formed on the silicon substrate 1 to cover the MOS transistor 3. A first contact hole 4a and a second contact hole 4b are formed in the first interlayer insulating film 4 on the first n-type impurity diffusion layer 3c and the second n-type impurity diffusion layer 3d respectively.

A first conductive plug 5a and a second conductive plug 5b are buried in the first and second contact holes 4a, 4b respectively. The first and second conductive plugs 5a, 5b have a double-layered structure consisting of a titanium nitride film and a tungsten film respectively.

A first-layer wiring 7 that is connected to the second conductive plug 5b and made of aluminum is formed on the first interlayer insulating film 4. Also, a second interlayer insulating film 8 made of any one of $SiO_2$, BPSG, PSG, etc. is formed on the first interlayer insulating film 4 and the first-layer wiring 7. A contact hole 8a is formed in the second interlayer insulating film 8 on the first conductive plug 5a. A third conductive plug 9 having a double-layered structure consisting of the titanium nitride film and the tungsten film is buried in the contact hole 8a.

The second interlayer insulating film 8 and the third conductive plug 9 is covered with a third interlayer insulating film 10 that has a thickness of 350 nm and is made of $SiO_2$. Then, a first wiring trench 10a and a second wiring trench 10b are formed in the third interlayer insulating film 10.

The first wiring trench 10a has a shape a part of which overlaps with the third conductive plug 9. A first copper wiring 12a having a multi-layered structure consisting of a barrier metal layer 11a made of tantalum, tantalum nitride, titanium nitride, or the like and a copper layer 11b is formed in the first wiring trench 10a. Also, a second copper wiring 12b having the same layer structure as the first copper wiring 12a is formed in the second wiring trench 10b.

After the first and second copper wirings 12a, 12b are formed as described above, as shown in FIG. 2B, a first cap layer 13 made of zirconium nitride (ZrN) is formed on the third interlayer insulating film 10 and the first and second copper wirings 12a, 12b. The formation of the zirconium nitride may be executed by the CVD method using tetrakisdiethylaminozirconium ($Zr\{N(C_2H_5)_2\}_4$; TDEAZ) or the PVD method such as the sputter, the evaporation, or the like.

The ZrN cap layer 13 is formed to have a thickness that is larger than 0 nm but is less than 20 nm. Such ZrN cap layer 13 acts as a low resistance layer 13a, whose resistivity is less than about 300 $\mu\Omega\cdot$cm, in the region where the ZrN cap layer 13 contacts to the barrier metal layer 11a and the copper layer 11b constituting the first and second copper wirings 12a, 12b, and acts as a high resistance layer 13b, whose resistivity is more than several thousands $\mu\Omega\cdot$cm or more than tens of thousands of $\mu\Omega\cdot$cm, in the region where the ZrN cap layer 13 contacts to the third interlayer insulating film 10 made of $SiO_2$. Their details will be described later.

Figure 2C:
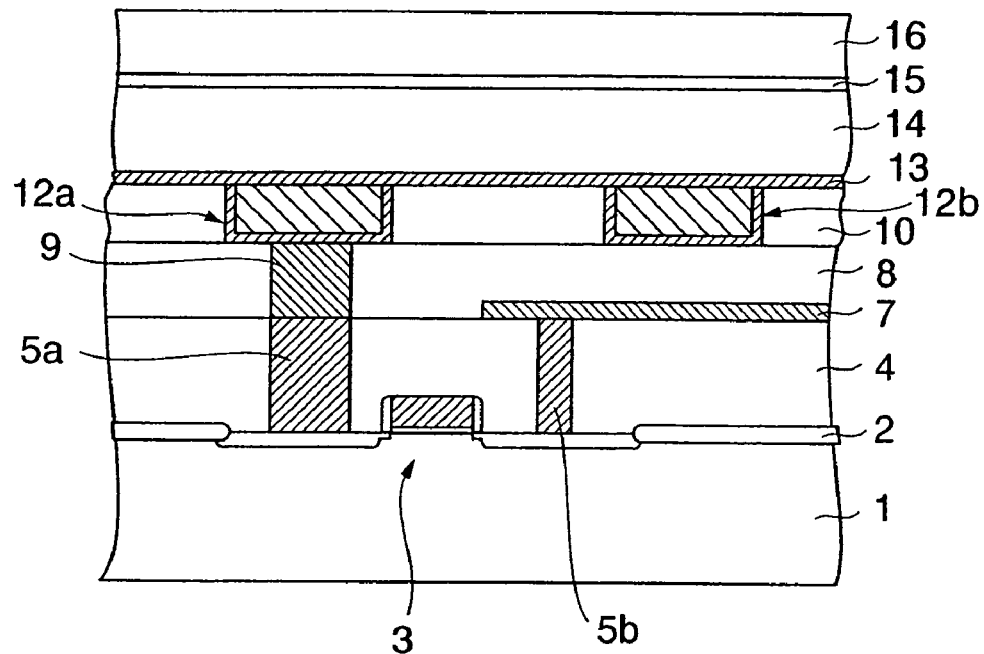

Then, as shown in FIG. 2C, a fourth interlayer insulating film 14 having a thickness of 350 nm and made of $SiO_2$ is formed on the ZrN cap layer 13 by the CVD method. And, a silicon nitride film 15 having a thickness of 50 nm is formed on the fourth interlayer insulating film 14 by the CVD. More, a fifth interlayer insulating film 16 having a thickness of 300 nm and made of $SiO_2$ is formed on the silicon nitride film 15. In this case, a zirconium nitride film having a thickness of less than 20 nm may be employed in place of the silicon nitride film 15.

Figure 2D:
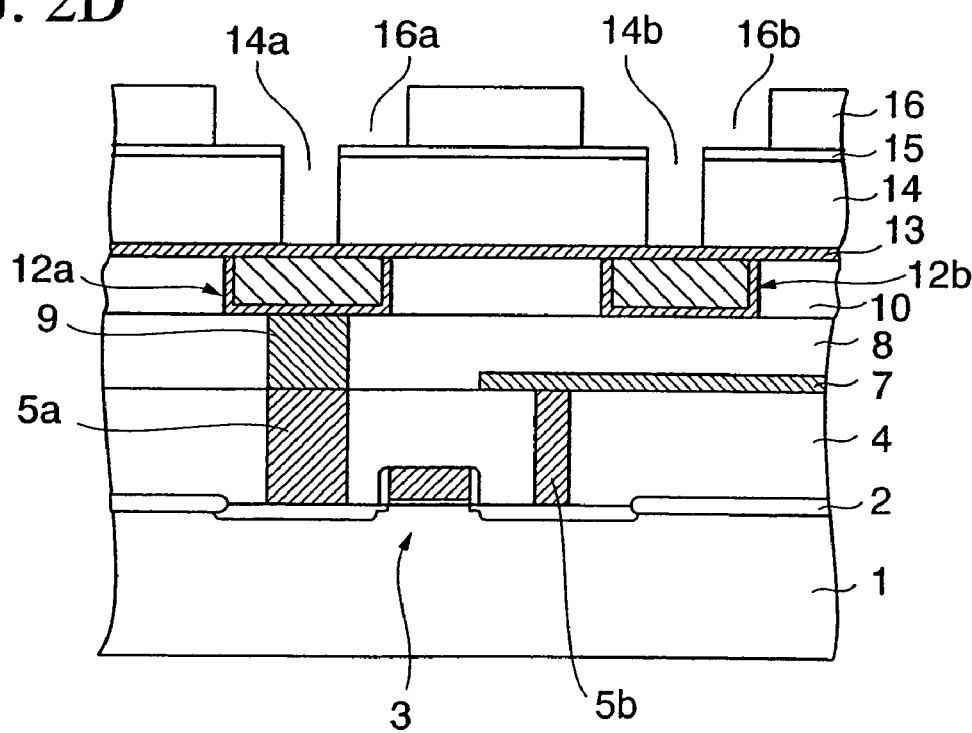

Then, as shown in FIG. 2D, the fifth interlayer insulating film 16 is patterned, so that a third wiring trench 16a a part of which overlaps with the first copper wiring 12a is formed and simultaneously a fourth wiring trench 16b a part of which overlaps with the second copper wiring 12b is formed. Also, the fourth interlayer insulating film 14 is patterned, so that a first via hole 14a is formed in the region at which the third wiring trench 16a overlaps with the first copper wiring 12a and at the same time a second via hole 14b is formed in the region at which the fourth wiring trench 16b overlaps with the second copper wiring 12b.

The order of the formation of the first and second via holes 14a, 14b and the formation of the third and fourth wiring trenches 16a, 16b may be selected arbitrarily. The silicon nitride film 15 can function as the etching stopper layer at the time when the third and fourth wiring trenches 16a, 16b are formed.

These via holes 14a, 14b are formed on the first-layer copper wirings 12a, 12b respectively to expose the low resistance layer 13a of the ZrN cap layer 13.

Figure 2E:
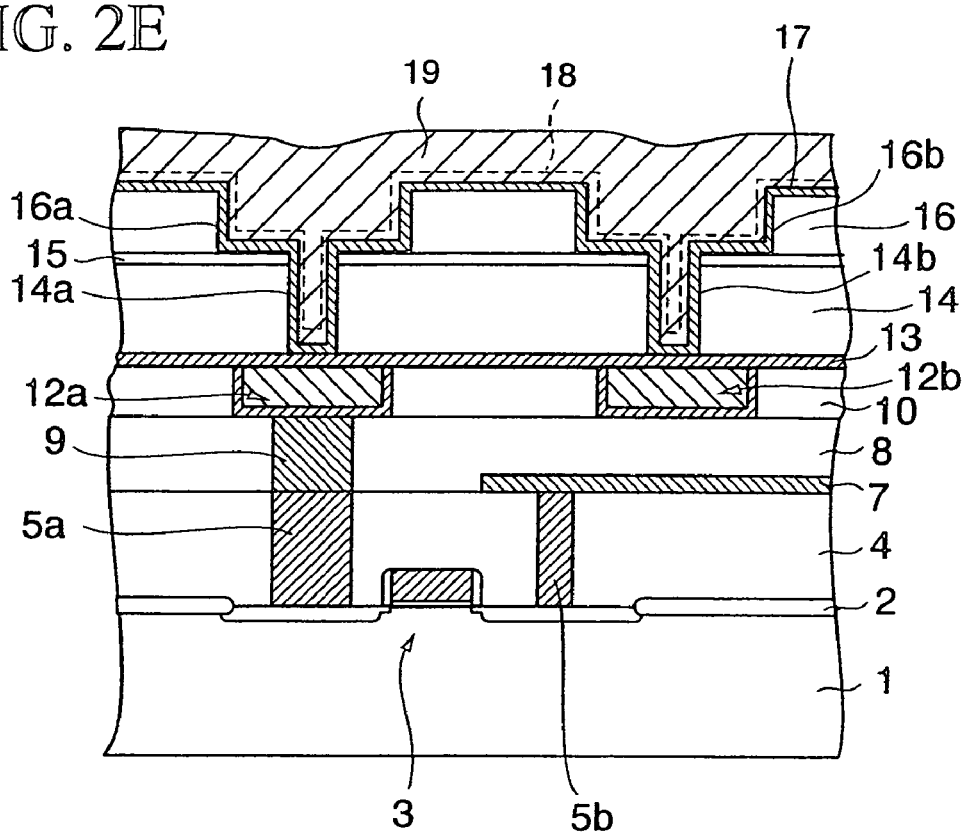

Then, as shown in FIG. 2E, a barrier metal layer 17 of 5 to 10 nm thickness is formed on inner peripheral surfaces and bottom surfaces of the first and second via holes 14a, 14b and the third and fourth wiring trenches 16a, 16b and on the upper surface of the fifth interlayer insulating film 16 respectively. The barrier metal layer 17 is formed by the sputter method and is formed any one of tantalum (Ta), tantalum nitride (TaN), and their laminated film, or titanium nitride (TiN), for example.

In addition, a copper seed layer 18 is formed on the barrier metal layer 17 by the sputter method to have a thickness of 30 to 100 nm.

Then, a copper layer 19 is formed on the copper seed layer 18 by the electrolytic plating, whereby the third and fourth wiring trenches 16a, 16b and the first and second via holes 14a, 14b are completely buried. Here, the copper seed layer 18 becomes a part of the copper layer 19.

Figure 2F:
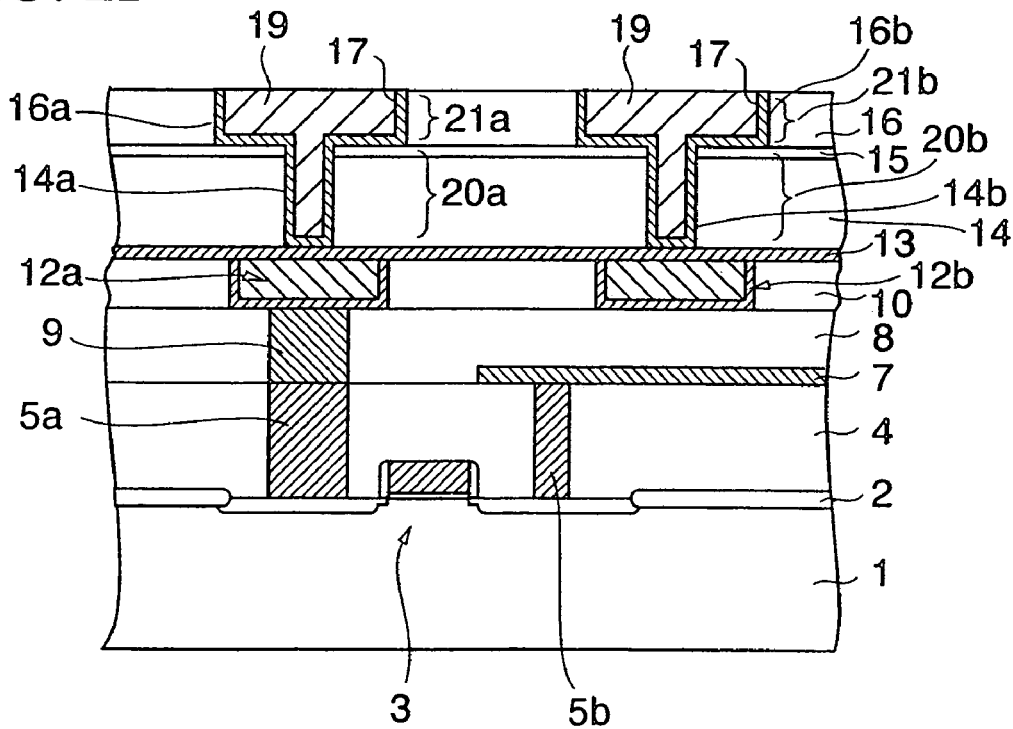

Then, as shown in FIG. 2F, the copper layer 19 and the barrier metal layer 17 formed on the fifth interlayer insulating film 16 are removed by the CMP method. Thus, the copper layer 19, the copper seed layer 18, and the barrier metal layer 17 left in the first and second via holes 14a, 14b are used as first and second vias 20a, 20b respectively. Also, the copper layer 19 and the barrier metal layer 17 left in the third and fourth wiring trenches 16a, 16b are used as third and fourth copper wirings 21a, 21b respectively.

The third copper wiring 21a is connected electrically to the first copper wiring 12a via the first via 20a and the cap layer 13. Also, the fourth copper wiring 21b is connected electrically to the second copper wiring 12b via the second via 20b and the cap layer 13.

In addition, after a second-layer cap layer (not shown) that is made of the same material as the above cap layer 13 and has a thickness of less than 20 nm is formed on the third and fourth copper wirings 21a, 21b and the fifth interlayer insulating film 16, the copper wiring having the multi-layered structure can be formed on the second interlayer insulating film 8 by repeating the formations of the interlayer insulating film, the copper wiring and the via in compliance with the above steps.

Meanwhile, the first and second vias 20a, 20b are connected to the first and second copper wirings 12a, 12b via the low resistance layer 13a of the ZrN cap layer 13, which has a thickness of less than 20 nm, respectively. In this case, since the ZrN cap layer 13 acts as the high resistance layer 13b on the second interlayer insulating film 10 made of $SiO_2$, the third copper wiring 21a and the fourth copper wiring 21b are never short-circuited via the ZrN cap layer 13. In addition, since the zirconium nitride is chemically stable and is less oxidized than the copper, it is not possible that the ZrN cap layer 13 is oxidized or corroded even when such layer is exposed through the via hole and the wiring trench. Thus, the ZrN cap layer 13 can serve as the conductive/insulating protection film that prevents the oxidation and the corrosion of the copper wiring and the copper via.

The event that the electrical resistance value of the zirconium nitride film depends on the material of the underlying layer will be explained hereunder.

Figure 3:
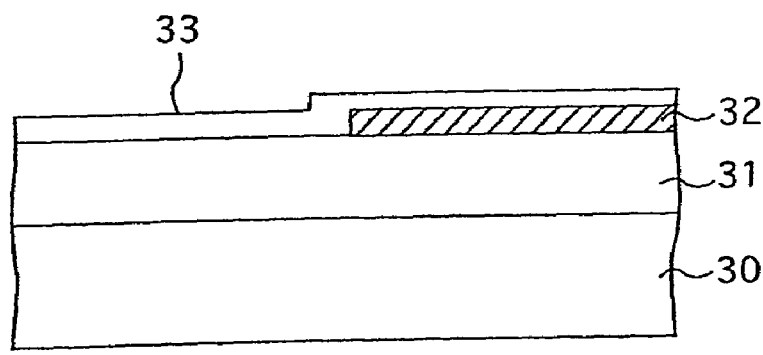
FIG. 3 is a sectional view showing a sample employed to check an underlying-layer dependency of a resistivity of a zirconium nitride film used in the semiconductor device according to the embodiment of the present invention.

First, as shown in FIG. 3, an insulating film 31 having a thickness of 100 nm and made of $SiO_2$ and a metal film 32 having a thickness of 50 nm and made of titanium nitride (TiN) are formed in sequence on a silicon wafer 30, and then a part of the insulating film 31 is exposed by patterning the metal film 32. Then, a zirconium nitride (ZrN) film 33 is formed on the insulating film 31 and the metal film 32 by the CVD method. As the material used to form the zirconium nitride film 33 by the CVD method, TDEAZ and ammonia ($NH_3$) are employed. Also, the temperature of the silicon wafer 30 is set at 380° C. when the zirconium nitride film 33 is to be grown.

Figure 4:
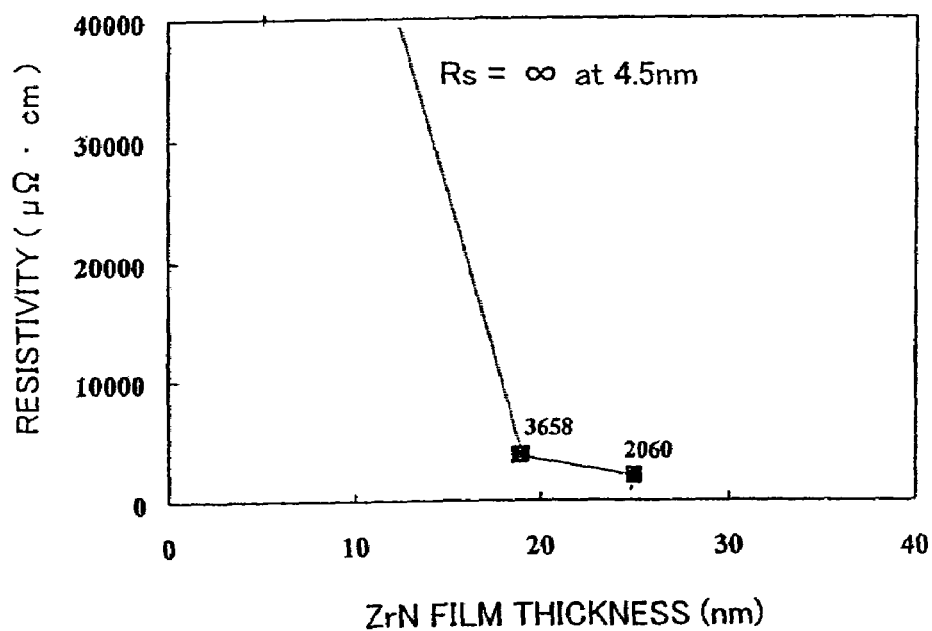
FIG. 4 is a graph showing a relationship between a film thickness and the resistivity of the zirconium nitride film on the insulating film.

When a relationship between the film thickness and the resistivity of the zirconium nitride film 33 formed on the $SiO_2$ insulating film 31 is examined while changing the film thickness of the ZrN film 33 formed under such conditions, results shown in FIG. 4 are obtained. According to FIG. 4, the resistivity of the zirconium nitride film 33 becomes about 3300 $\mu\Omega$·cm when the film thickness is 20 nm, and the resistivity is abruptly increased when the film thickness is less than about 18.7 nm, and the resistivity becomes 10000 $\mu\Omega$·cm when the film thickness is 17.8 nm. In this case, even if a silicon oxide nitride film, a silicon nitride film, or a silicon oxide fluoride film is used as the insulating film 31, the similar results can be obtained.

Figure 5:
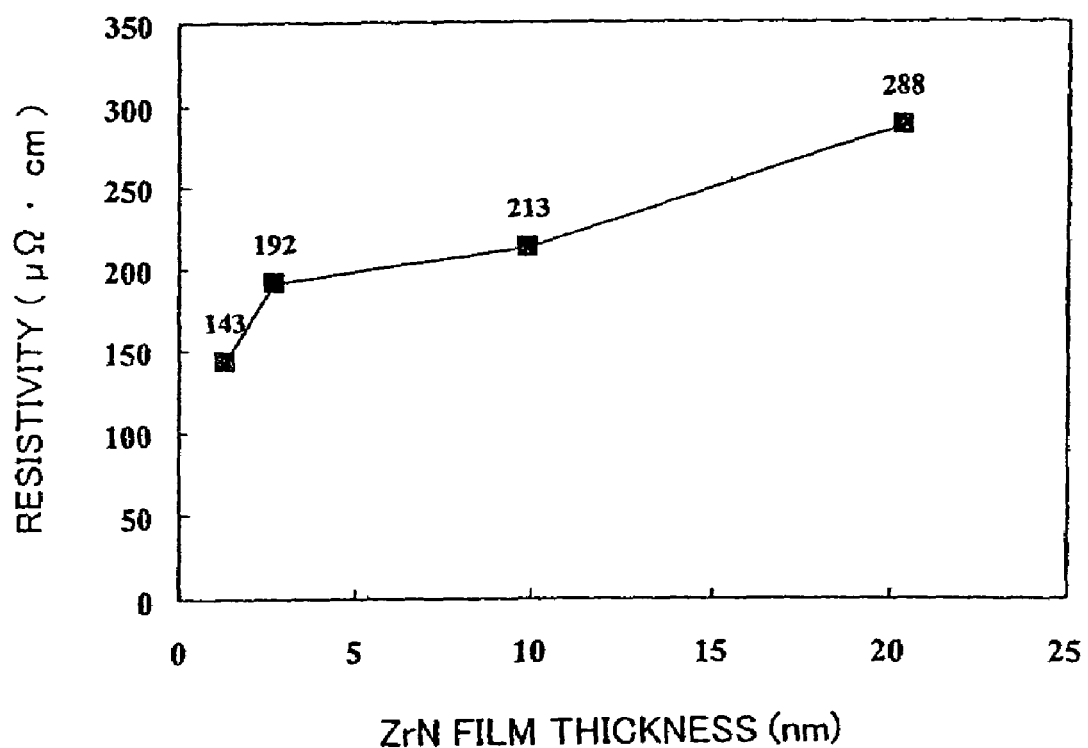
FIG. 5 is a graph showing a relationship between the film thickness and the resistivity of the zirconium nitride film on the metal film.

While, when a relationship between the film thickness and the resistivity of the zirconium nitride film 33 formed on the TiN metal film 32 is examined, results shown in FIG. 5 are obtained. If the copper film is used as the metal film 32, the similar results are obtained.

According to FIG. 4 and FIG. 5, if the zirconium nitride film 33 is formed on the insulating film 31 to have the thickness of less than 20 nm, the resistivity is increased to give the insulating film whose resistivity is more than several thousands $\mu\Omega$·cm. In contrast, even if the film thickness of the zirconium nitride film 33 is less than 20 nm, the zirconium nitride film 33 formed on the metal film 32 acts as the conductive film whose resistivity is less than about 300 $\mu\Omega$·cm.

As a result, it is understood that the resistivity of the zirconium nitride film depends on the material of an underlying film. This nature is similar in case the zirconium nitride film is formed by not the CVD method but the PVD method such as the sputter, the evaporation, or the like.

In this case, as the cap layer 13, a film made of any substance of the zirconium nitride compound, the zirconium, the titanium, the hafnium, the zirconium compound, the titanium compound, or the hafnium compound may be formed in place of the zirconium nitride to have a thickness that is larger than 0 nm but less than 20 nm, for example. If the substance constituting the cap layer 13 is formed by the PVD method such as the sputter, etc., it is preferable that such substance should be oxidized on the third interlayer insulating film 10 by using the oxygen in the third interlayer insulating film 10 by annealing the formed substance at the temperature of almost 400° C., for example, to increase the electrical resistance. Also, if the oxidation of the substance constituting the cap layer 13 on the copper wirings 12a, 12b must be prevented perfectly, it is preferable that the cap layer 13 should be alloyed with upper portions of the first and second copper wirings (copper patterns) 12a, 12b.

In the meanwhile, after the silicon oxide film of 100 nm thickness and the zirconium nitride film of 10 nm thickness were formed sequentially on the silicon wafer, the titanium nitride (TiN) film of 50 nm thickness was formed on the zirconium nitride film at the wafer temperature of 350° C. by the CVD method using the tetrakisdiethylaminotitanium (TDEAT) and the ammonia ($NH_3$). Then, when the resistivity of the titanium nitride film was measured, 200 $\mu\Omega\cdot cm$ was obtained. Thus, it is found that the resistance of the TiN film (metal film) formed on the portion, whose resistance is increased higher, of the zirconium nitride film is not increased higher.

(Second Embodiment)

In the first embodiment, the cap layer 13 made of ZrN, Zr, Hf, or the like is formed on the copper wirings 12a, 12b and the third interlayer insulating film 10. If the copper wirings 12a, 12b and the cap layer 13 are alloyed with each other by the annealing process, there is a possibility that copper elements are diffused from the cap layer 13 into the third interlayer insulating film 10 and the fourth interlayer insulating film 14.

Therefore, steps of forming the semiconductor device having the structure that is able to prevent the copper diffusion into the third and fourth interlayer insulating films 10, 14 without fail will be explained hereunder.

FIGS. 6A to 6L are sectional views showing steps of manufacturing a semiconductor device according to a second embodiment of the present invention. In FIGS. 6A to 6L, the same symbols as those in FIGS. 2A to 2f denote the same elements.

Figure 6A:
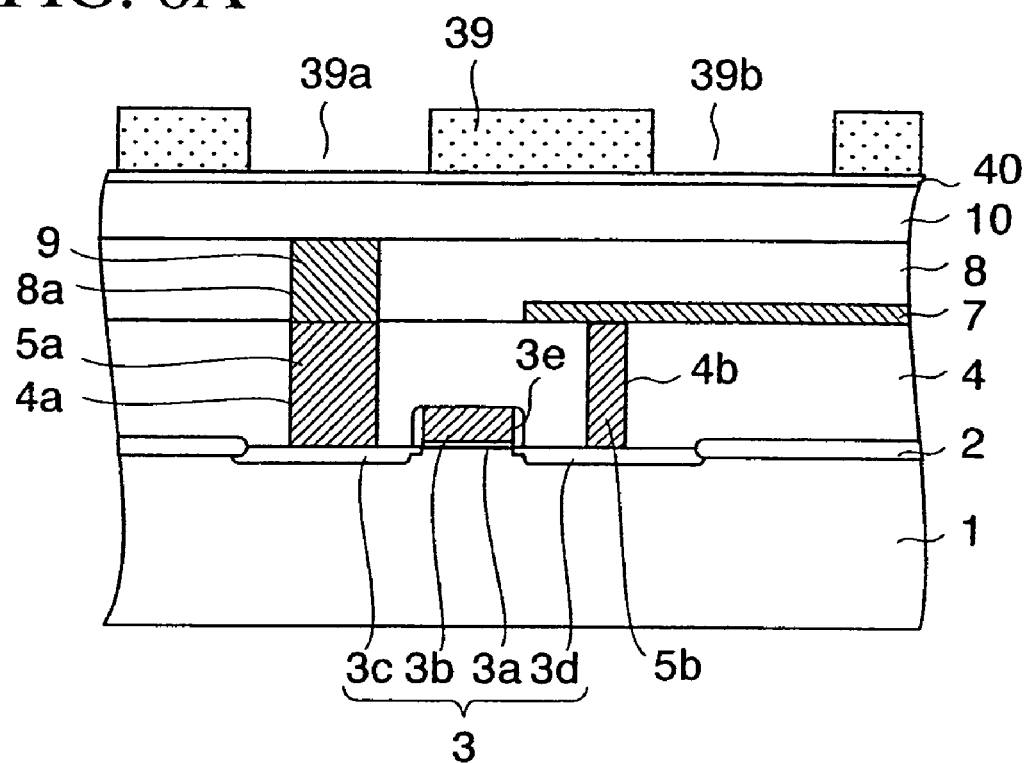
FIGS. 6A to 6L are sectional views showing a semiconductor device manufacturing method according to a second embodiment of the present invention.

First, steps required to form the structure shown in FIG. 6A will be explained hereunder.

The element isolation insulating layer 2 is formed on the p-type silicon substrate 1 to surround the active element region, and then the MOS transistor 3 having the structure shown in the first embodiment is formed in the active element region.

Then, the first interlayer insulating film 4 made of $SiO_2$ is formed on the silicon substrate 1 to cover the MOS transistor 3. Then, the first contact hole 4a and the second contact hole 4b are formed in the first interlayer insulating film 4 on the first n-type impurity diffusion layer 3c and the second n-type impurity diffusion layer 3d respectively. Then, the first conductive plug 5a and the second conductive plug 5b are buried in the first contact hole 4a and the second contact hole 4b respectively. The first and second conductive plugs 5a, 5b have the double-layered structure consisting of the titanium nitride film and the tungsten film respectively.

Then, the first-layer wiring 7 that is connected to the second conductive plug 5b and made of aluminum is formed on the first interlayer insulating film 4. Then, the second interlayer insulating film 8 is formed on the first interlayer insulating film 4 and the first-layer wiring 7. Then, the contact hole 8a is formed in the second interlayer insulating film 8 on the first conductive plug 5a, and then the third conductive plug 9 having the double-layered structure consisting of the titanium nitride film and the tungsten film is buried in the contact hole 8a.

In this state, the third interlayer insulating film 10 that has a thickness of 300 nm and made of $SiO_2$ is formed on the second interlayer insulating film 8 and the third conductive plug 9 by the CVD method. Then, the silicon nitride film of 50 nm thickness is formed on the third interlayer insulating film 10 by the CVD method as a insulating first stopper layer 40.

Then, resist 39 is coated on the first stopper layer 40, and then opening portions 39a, 39b having wiring patterns that pass over the third conductive plug 9 are formed by exposing/developing the resist 39.

Figure 6B:
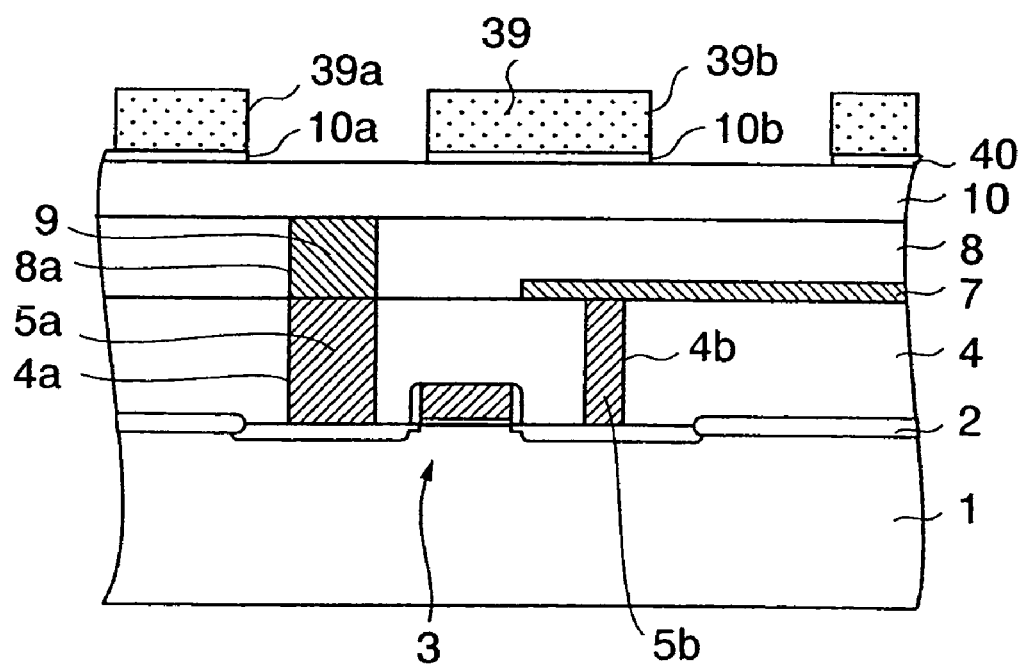
Figure 6C:
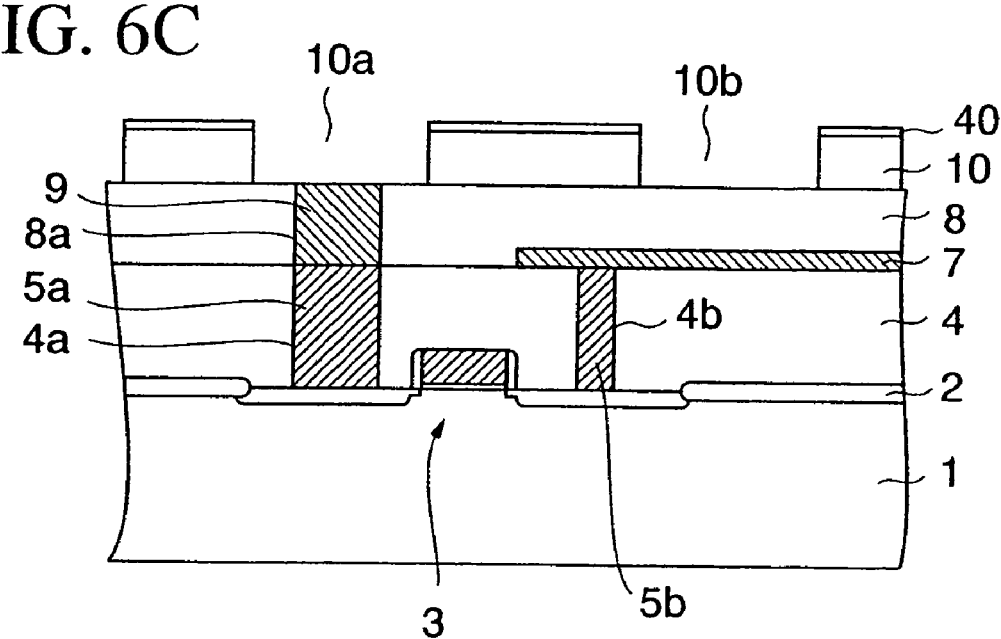

Then, as shown in FIGS. 6B and 6C, the first and second wiring trenches 10a, 10b are formed in the first stopper layer 40 and the third interlayer insulating film 10 by the etching using the resist 39 as a mask. The first wiring trench 10a has a shape a part of which is positioned on the third conductive plug 9. In this case, as shown in FIG. 6C, the first and second wiring trenches 10a, 10b may be formed by etching the third interlayer insulating film 10 while using the first stopper layer 40, in which openings are formed, as a mask.

Figure 6D:
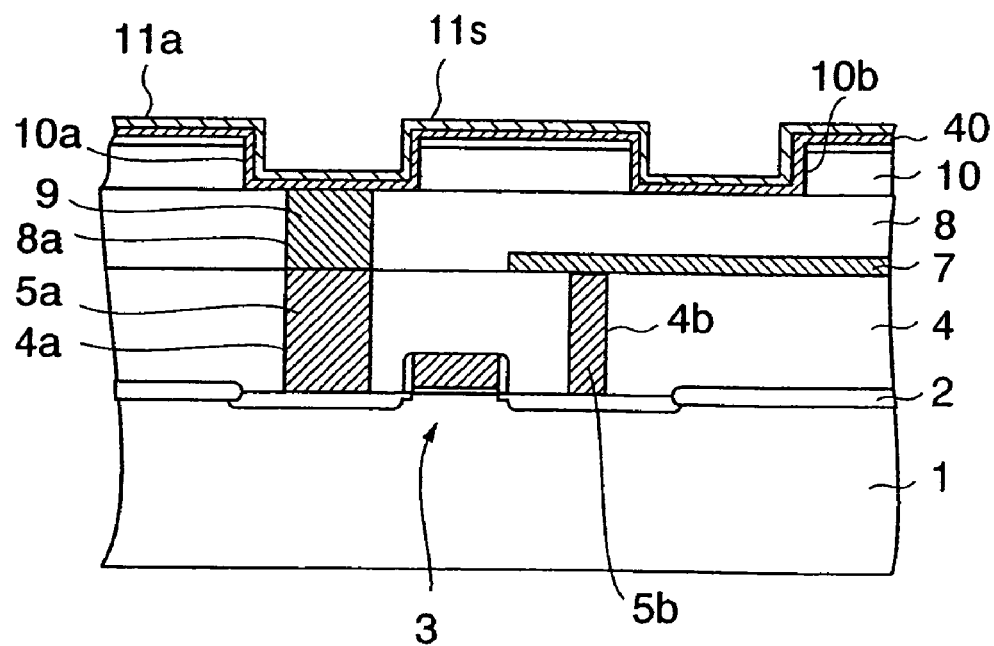

Then, as shown in FIG. 6D, the first barrier metal layer 11a is formed on inner peripheral surfaces and bottom surfaces of the first and second wiring trenches 10a, 10b and the upper surface of the first stopper layer 40 respectively. The barrier metal layer 11a is formed by the sputter method and is made of any one of Ta, TaN, and their laminated film, or TiN, for example.

In addition, the copper seed layer 11s is formed on the barrier metal layer 11a by the sputter method to have a thickness of 30 to 100 nm.

Figure 6E:
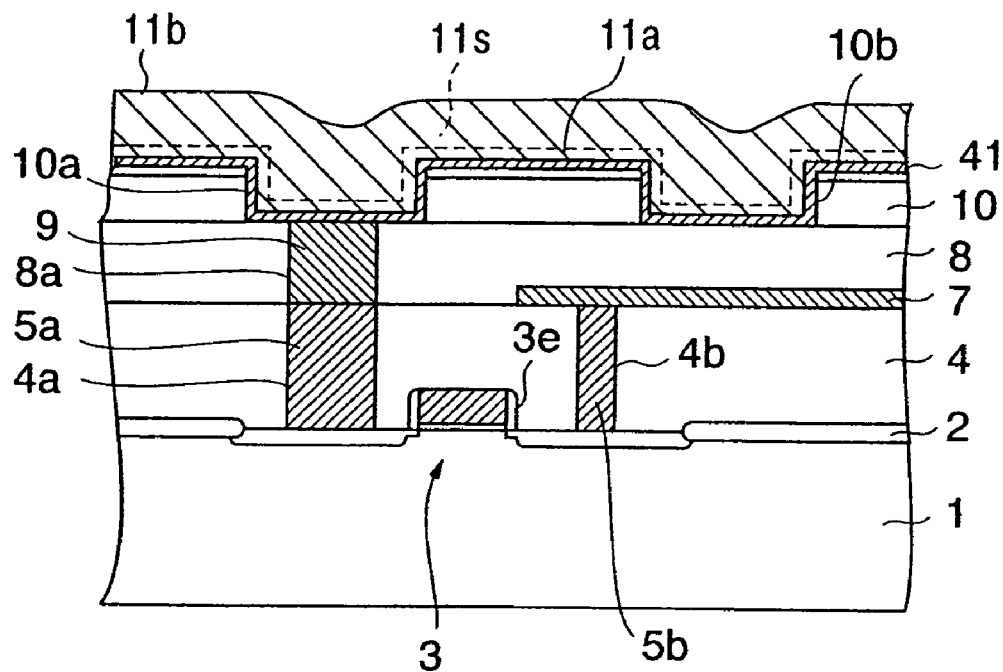

Then, as shown in FIG. 6E, the copper layer 11b is formed on the copper seed layer 11s by the electrolytic plating method, whereby the first and second wiring trenches 10a, 10b are completely buried. In this case, the copper seed layer 11s is contained in the copper layer 11b.

Figure 6F:
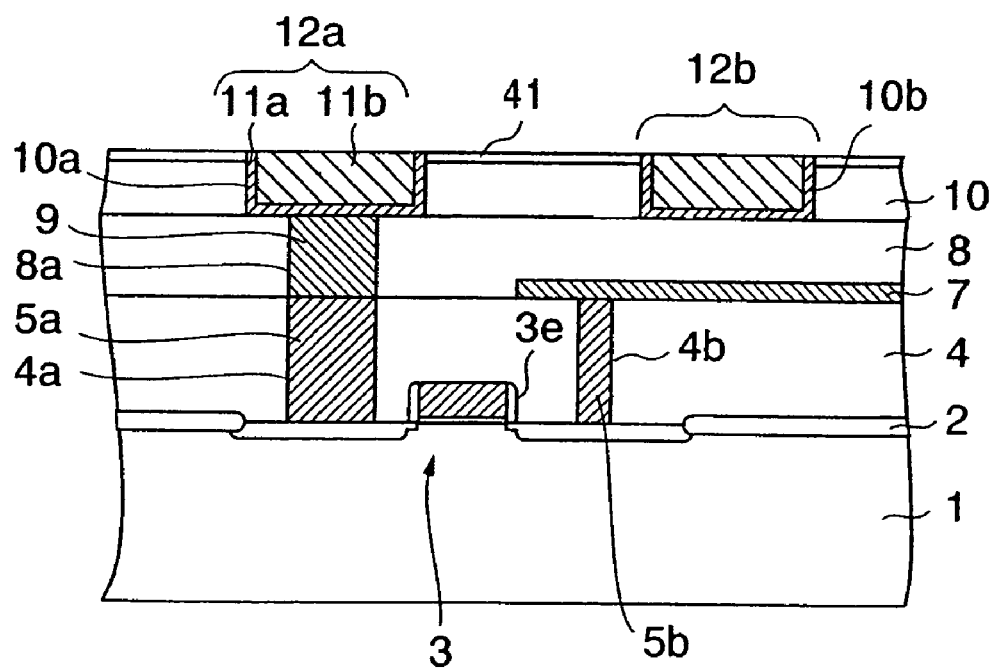

Then, as shown in FIG. 6F, the copper layer 11b and the barrier metal layer 11a formed on the upper surface of the third interlayer insulating film 10 are removed by the CMP method. Here the first stopper layer 40 acts as the CMP stopper. Accordingly, the copper layer 11b and the barrier metal layer 11a left in the first and second wiring trenches 10a, 10 are used as the first and second copper wirings 12a, 12b respectively.

Figure 6G:
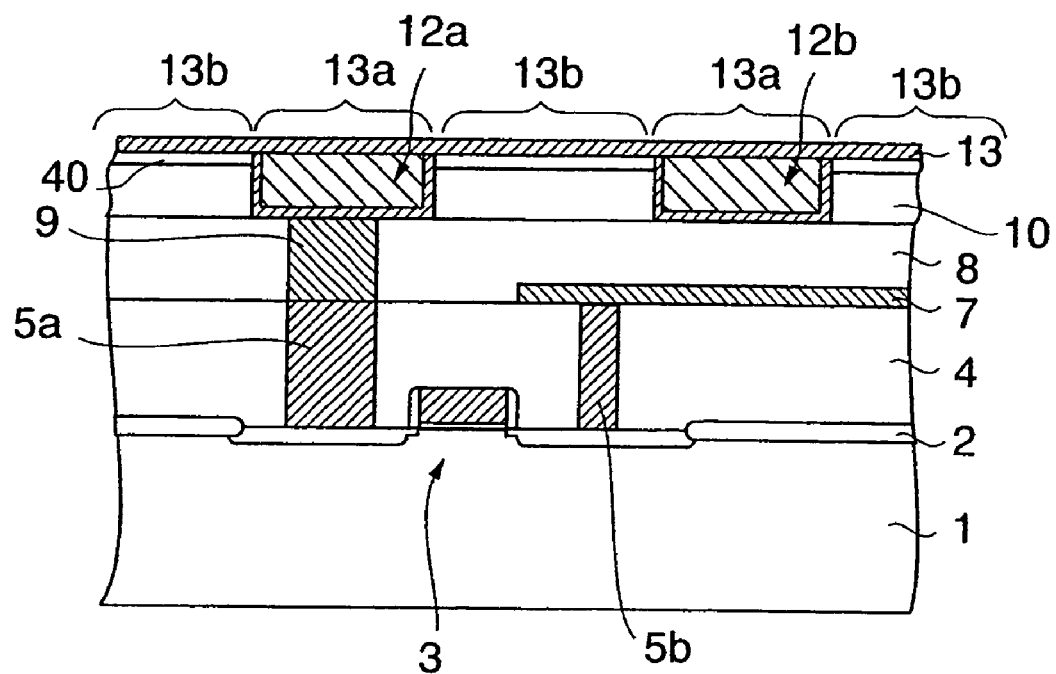

After the first-layer copper wirings 12a, 12b are formed as above, as shown in FIG. 6G, the first cap layer 13 made of zirconium nitride (ZrN) is formed on the first stopper layer 40 and the first and second copper wirings 12a, 12b. This first cap layer 13 is formed by the ZrN forming method explained in the first embodiment.

As explained in the first embodiment, the first cap layer 13 made of ZrN is formed to have a thickness that is larger than 0 nm but smaller than 20 nm. Such ZrN cap layer 13 acts as the low resistance layer 13a, whose resistivity is less than about 300 $\mu\Omega\cdot cm$, in the region where the ZrN cap layer 13 contacts to the barrier metal layer 11a and the copper layer 11b constituting the first and second copper wirings 12a, 12b, and acts as the high resistance layer 13b, whose resistivity is more than several thousands $\mu\Omega\cdot cm$ or more than tens of thousands of $\mu\Omega\cdot cm$, in the region where the ZrN cap layer 13 contacts to the third interlayer insulating film 10 made of $SiO_2$.

Figure 6H:
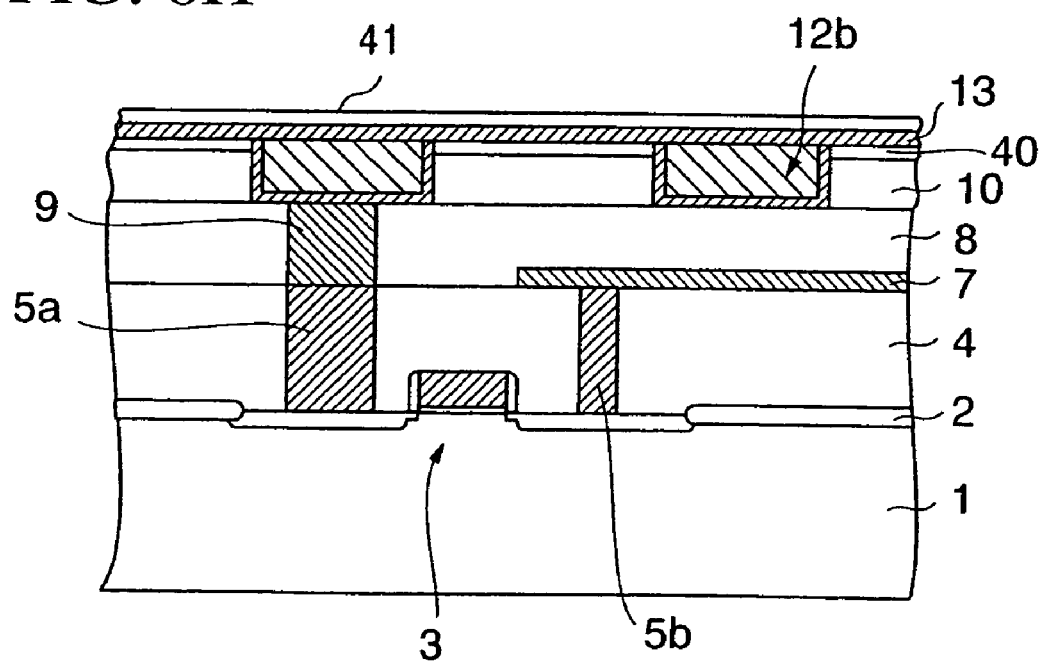

Then, as shown in FIG. 6H, an insulating second cap layer 41 having the copper diffusion preventing function is formed on the first cap layer 13. As the second cap layer 41, an insulating layer made of silicon carbide (SiC), silicon nitride (SiN), or substance containing them as the base element, an insulating layer made of silicon carbide oxide (SiCO), silicon oxide nitride (SiON), or substance containing them as the base element, or the like is formed by the plasma-enhanced chemical vapor deposition (PE-CVD) method to have a thickness of 20 to 100 nm.

Typically the growth of these insulating layers constituting the second cap layer 41 is carried out by employing the parallel-plate type PE-CVD equipment, then introducing the material gas into the vacuum chamber, into which the silicon substrate 1 is loaded, through the shower head, then adjusting the substrate temperature at 350 to 400° C. by the pedestal, and then applying the high frequency power, whose power is 300 to 600 W and whose frequency is 13.56 MHz, to the electrode that opposes to the substrate.

In the formation of the silicon carbide, the organic silane formed mainly of the methylsilane is employed as the material, and also methane, ammonia, nitrogen, helium, etc. are added if necessary.

Also, in the formation of the silicon carbide oxide, the oxygen source such as the oxygen, the nitrogen monoxide, etc. is added to the gas used to form the silicon carbide. Normally, if the oxygen is added to the insulating film, there is the advantage that the dielectric constant of the film can be lowered and thus the adhesion between the insulating films can be improved, but the function as the copper diffusion preventing film is lowered.

In the formation of the silicon nitride, such silicon nitride is grown by the PE-CVD method, like the silicon carbide insulating film. In this case, typically the silane gas such as $SiH_4$, $Si_2H_6$, etc. is used as the silicon material gas, and the silicon nitride may be also formed by using the organic silane gas. The nitrogen or the ammonia is supplied to the growth atmosphere as the nitrogen supply source together with the silicon material gas. In the formation of the silicon oxide nitride, the oxygen source such as the oxygen, the nitrogen monoxide is added to the gas used to grow the silicon nitride.

Figure 6I:
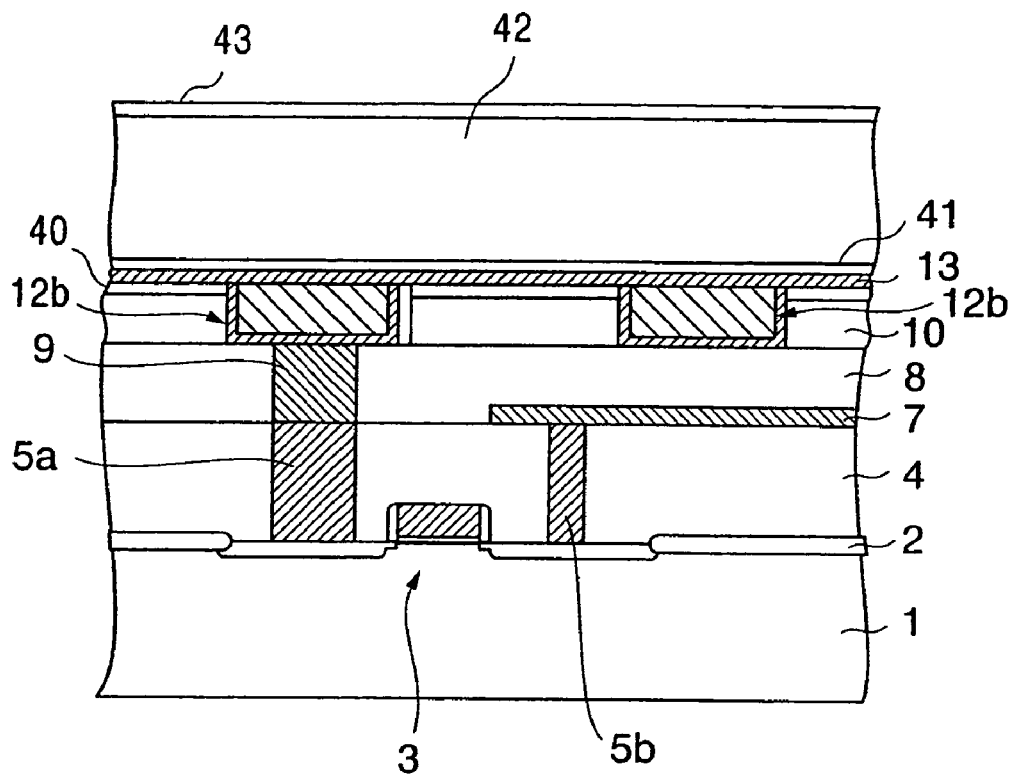

Then, the second cap layer 41 is formed under such conditions. Then, as shown in FIG. 6I, a fourth interlayer insulating film 42 that has a thickness of 600 nm and is made of $SiO_2$ and a second stopper layer 43 that has a thickness of 50 nm and is made of silicon nitride are formed in sequence on the second cap layer 41 by the CVD method.

Figure 6J:
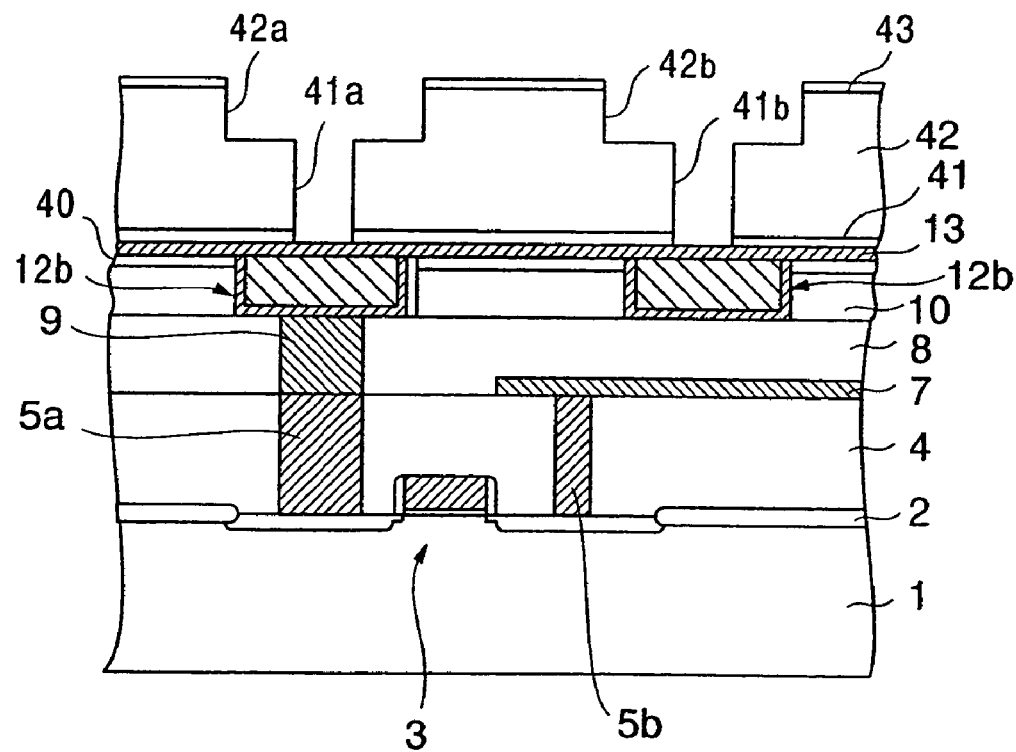

Then, as shown in FIG. 6J, the second stopper layer 43, the fourth interlayer insulating film 42, and the second cap layer 41 are patterned, so that first and second via holes 41a, 41b to expose the low resistance layer 13a of the first cap layer 13 are formed in the second stopper layer 43, the fourth interlayer insulating film 42, and the second cap layer 41, and also third and fourth wiring trenches 42a, 42b that overlap with the first and second via holes 41a, 41b respectively are formed in the second stopper layer 43 and the fourth interlayer insulating film 42. The third and fourth wiring trenches 42a, 42b are formed to have a depth of about 350 nm from the upper surface of the second stopper layer 43.

It may be selected arbitrarily which one of the formation of the first and second via holes 41a, 41b and the formation of the third and fourth wiring trenches 42a, 42b should be executed earlier, and separate resist patterns are employed as a mask respectively. Also, if the etching stopper layer such as the silicon nitride layer is formed in the middle of the fourth interlayer insulating film, the first and second via holes 41a, 41b and the third and fourth wiring trenches 42a, 42b may be formed by the steps similar to the first embodiment. The formation of the etching stopper layer in the fourth interlayer insulating film may be employed in following embodiments.

Figure 6K:
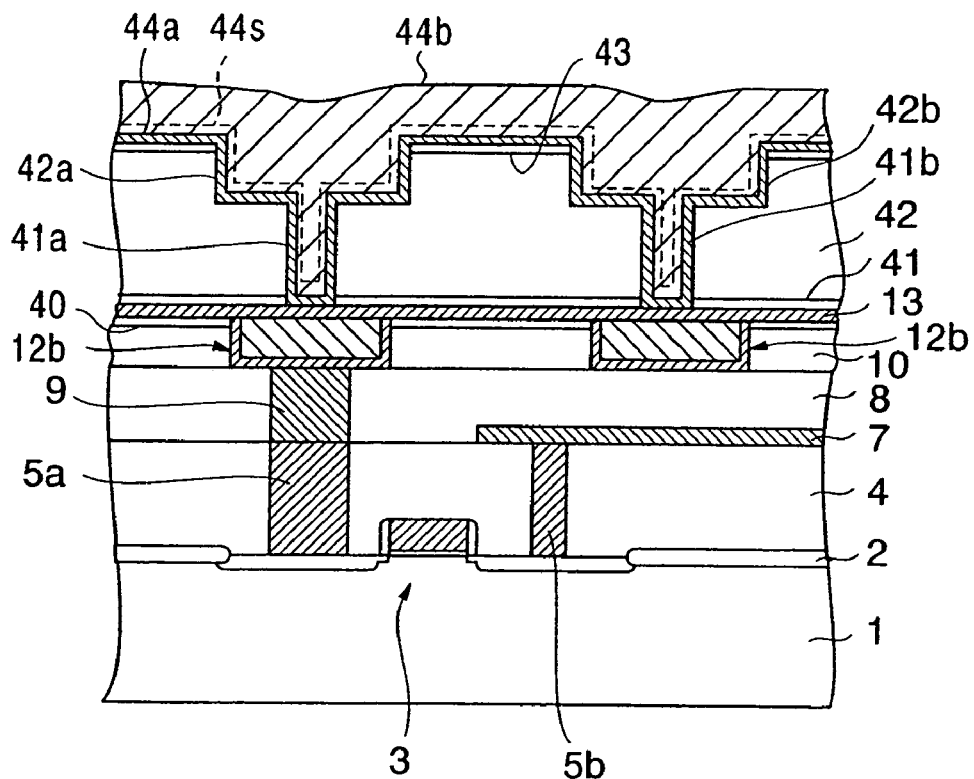

Then, as shown in FIG. 6K, a barrier metal layer 44a is formed on respective inner peripheral surfaces and bottom surfaces of the first and second via holes 41a, 41b and the third and fourth wiring trenches 42a, 42b and on the upper surface of the second stopper layer 43. The barrier metal layer 44a is formed by the sputter method and is constructed by any one of Ta, TaN, and their laminated film, or TiN, for example.

In addition, a copper seed layer 44s is formed on the barrier metal layer 44a by the sputter method to have a thickness of 30 to 100 nm.

Then, a copper layer 44b is formed on the copper seed layer 44s by the electrolytic plating method, whereby the third and fourth wiring trenches 42a, 42b and the first and second via holes 41a, 41b are buried completely. The copper seed layer 44s is formed integrally with the copper layer 44b.

Figure 6L:
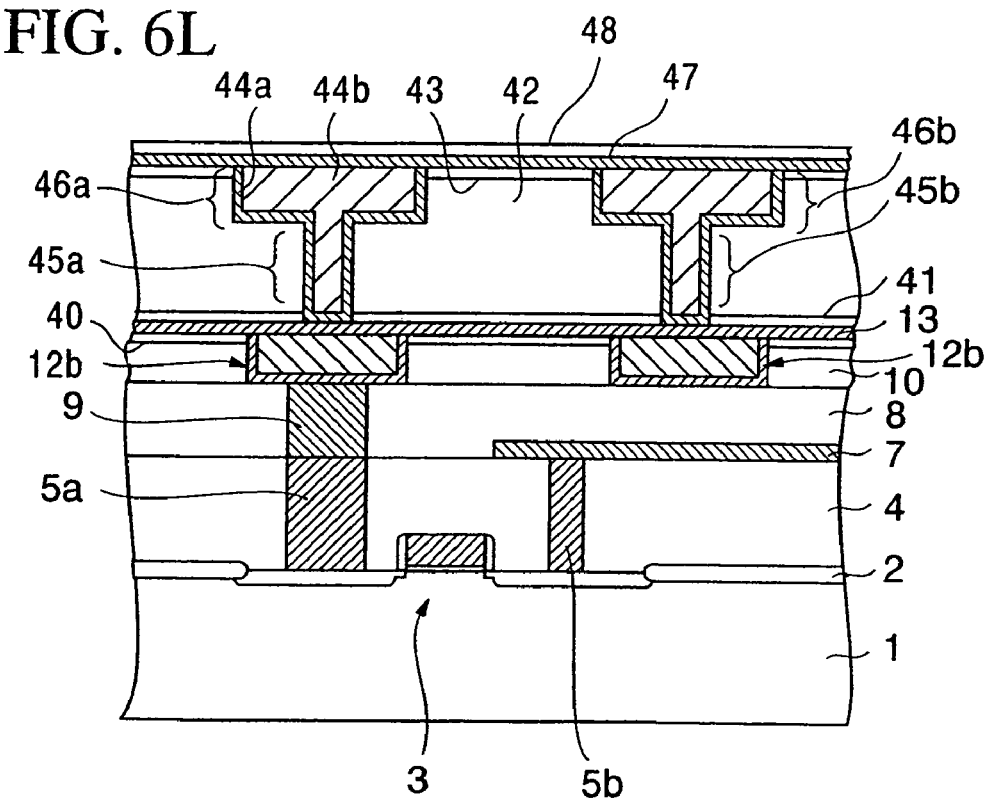

Next, steps required to form the structure shown in FIG. 6L will be explained hereunder.

The copper layer 44b and the barrier metal layer 44a are moved from the upper surface of the second stopper layer 43 by the CMP method while using the second stopper layer 43 as a polishing stopper. Thus, the copper layer 44b and the barrier metal layer 44a left in the first and second via holes 41a, 41b respectively are employed as first and second vias 45a, 45b whereas the copper layer 44b and the barrier metal layer 44a left in the third and fourth wiring trenches 42a, 42b are employed as third and fourth copper wirings 46a, 46b respectively.

The third copper wiring 21a is connected electrically to the first copper wiring 12a via the first via 20a and the cap layer 13. Also, the fourth copper wiring 21b is connected electrically to the second copper wiring 12b via the second via 20b and the cap layer 13.

Then, a third cap layer 47 made of the same material as the first cap layer 13 and a fourth cap layer 48 made of the same material as the second cap layer 43 are formed sequentially on the third and fourth copper wirings 46a, 46b and the second stopper layer 43.

In addition, the copper wiring having the multi-layered structure is formed on the second interlayer insulating film 8 by repeating the same formations of the interlayer insulating films, the copper wirings, and the vias as described above.

In the semiconductor device constructed as above, the portions of the first and third cap layers 13, 47 made of ZrN, which are to be connected to the copper wirings 12a, 12b, 46b, can act as the low resistance layer, while the portions of the first and third cap layers 13, 47, which are to be connected to the insulating first and second stopper layers 40, 43, can act as the high resistance layer.

If the first and second copper wirings 12a, 12b and the first cap layer 13 are alloyed with each other by the annealing, it is possible that the copper is diffused from the cap layer 13 to the fourth interlayer insulating film 42. However, in the present embodiment, since the insulating second cap layer 41 for preventing the copper diffusion is formed further on the first cap layer made of ZrN, the copper diffusion from the first and second copper wirings 12a, 12b to the fourth interlayer insulating film 42 can be prevented without fail by the second cap layer 41. Also, if the first and second stopper layers 40, 43 are formed of the silicon nitride, they can also function as the copper diffusion preventing layer.

Figure 7:
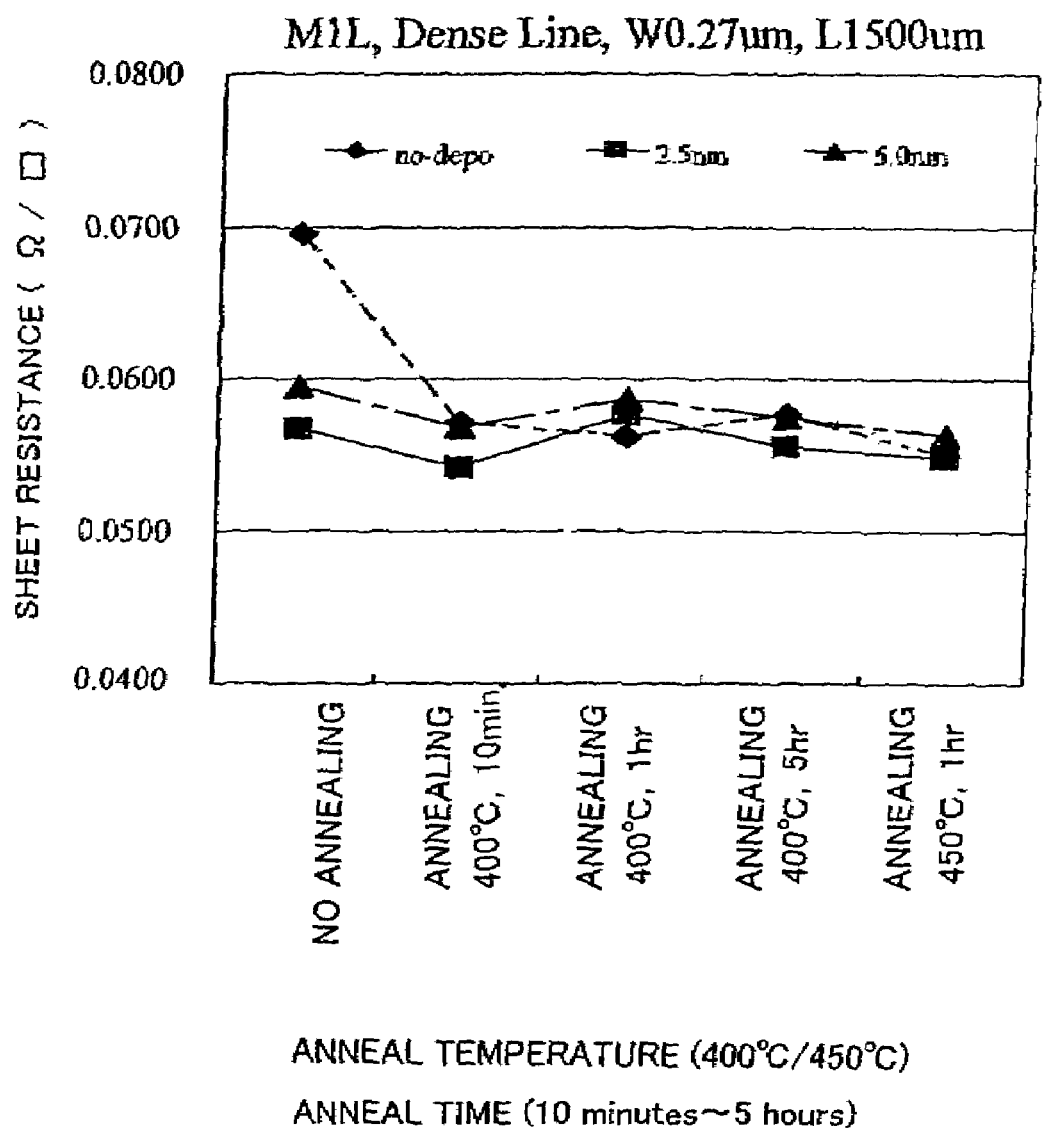
FIG. 7 is a graph showing changes in resistance of the wiring by annealing the copper wiring and the conductive cap layer formed thereon in the semiconductor device according to the embodiment of the present invention.

By the way, as shown in FIG. 6G, when it was examined how the sheet resistance of the copper wirings 12a, 12b is changed by the annealing after the first cap layer 13 made of ZrN is formed on the copper wirings 12a, 12b, results shown in FIG. 7 are obtained. Thus, it was found that the sheet resistance is seldom changed.

A broken line in FIG. 7 shows a difference between the, sheet resistance, which is obtained when the annealing is not applied, and the sheet resistance, which is obtained when the annealing is applied, of the copper wiring 12a, 12b without the formation of the first cap layer 13. Also, a solid line in FIG. 7 shows a difference between the sheet resistance, which is obtained when the annealing is not applied, and the sheet resistance, which is obtained when the annealing is applied, of the copper wiring 12a, 12b to which the first cap layer 13 of 2.5 nm thickness is connected. In addition, a dot-dash line in FIG. 7 shows a difference between the sheet resistance, which is obtained when the annealing is not applied, and the sheet resistance, which is obtained when the annealing is applied, of the copper wiring 12a, 12b to which the first cap layer 13 of 5.0 nm thickness is connected.

FIGS. 8A to 8C show examined result of a relationship between the resistance of the copper wirings, which means the ZrN cap layer 13 and the copper wirings 12a, 12b totally, and the film thickness of the ZrN cap layer 13. In this case, in FIGS. 8A to 8C, plural vertical lines show wiring widths of 8 $\mu$m (○), 4 $\mu$m (□), 2 $\mu$m (◇), 1 $\mu$m (×), 0.54 $\mu$m (+), and 0.27 $\mu$m (Δ) in order from the left respectively.

FIG. 8A shows a relationship between the resistance values of the copper wirings 12a, 12b and a cumulative percentage when the ZrN cap layer 13 is not formed. FIG. 8B shows a relationship between the resistance values of the copper wirings and the cumulative percentage when the ZrN cap layer 13 of 2 nm thickness is formed on the copper wirings 12a, 12b. FIG. 8C shows a relationship between the resistance values of the copper wirings and the cumulative percentage when the ZrN cap layer 13 of 4 nm thickness is formed on the copper wirings 12a, 12b.

According to FIGS. 8A to 8C, the dependency of the resistance of the cap wirings on the ZrN film thickness is not found.

In this case, as the insulating/conductive cap layers 13, 47, the film made of any one of the zirconium nitride compound, the zirconium, the titanium, the hafnium, the zirconium compound, the titanium compound, and the hafnium compound may be applied instead of the zirconium nitride. Such materials are true of following embodiments.

(Third Embodiment)

FIGS. 9A to 9E are sectional views showing steps of forming a semiconductor device according to a third embodiment of the present invention. In FIGS. 9A to 9E, the same symbols as those in FIGS. 6A to 6L denote the same elements.

In accordance with the steps shown in FIGS. 6A to 6F in the second embodiment, the MOS transistor 3 is formed on the silicon substrate 1, then the interlayer insulating films 4, 8, 10 and the first stopper layer 40 are formed, then the wiring 7 is formed, then conductive plugs 5a, 5b, 9 are formed, and then the first and second copper wirings 12a, 12b are formed.

Figure 9A:
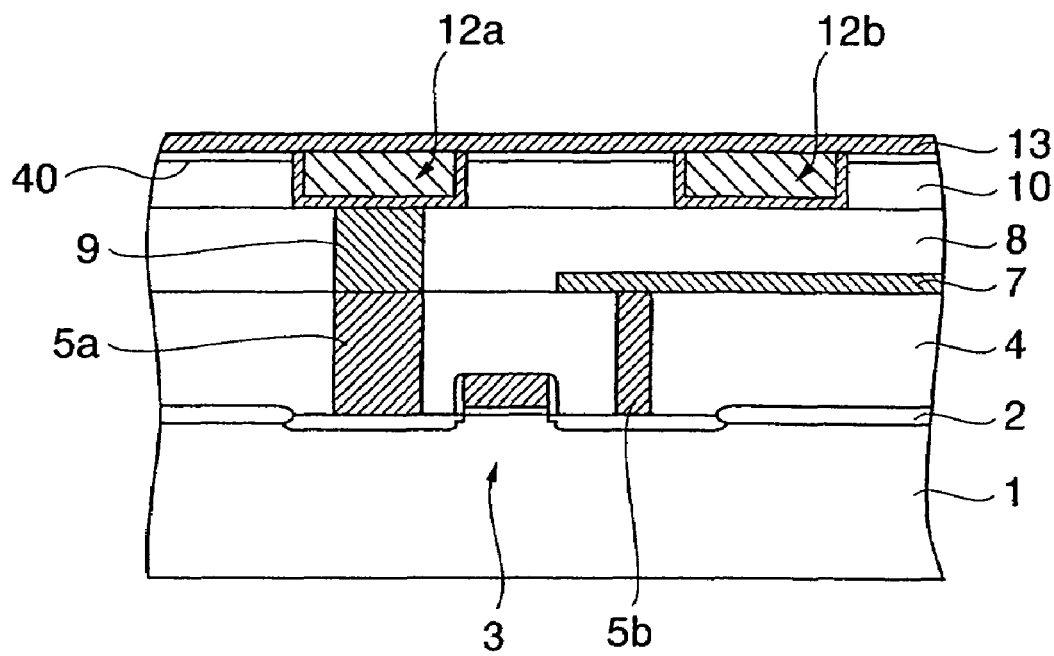
FIGS. 9A to 9E are sectional views showing a semiconductor device manufacturing method according to a third embodiment of the present invention.

Then, as shown in FIG. 9A, the first cap layer 13 made of ZrN is formed on the first and second copper wirings 12a, 12b and the first stopper layer 40. The film thickness of the first cap layer 13 is not limited below 20 nm as described in the first and second embodiments, and the first cap layer 13 is formed to have a thickness of 40 nm, for example.

Figure 9B:
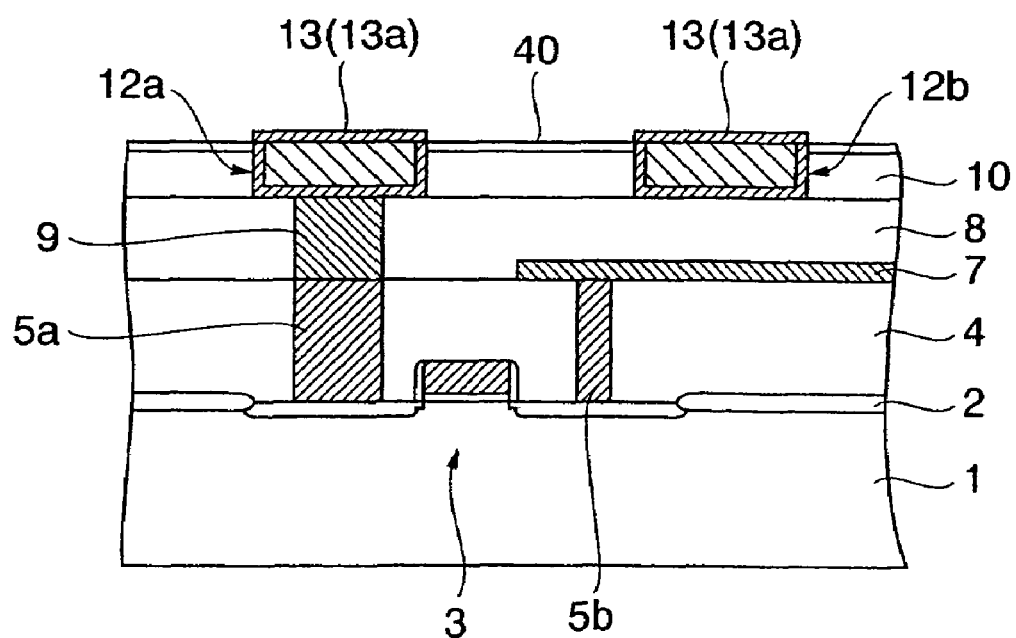
Figure 9C:
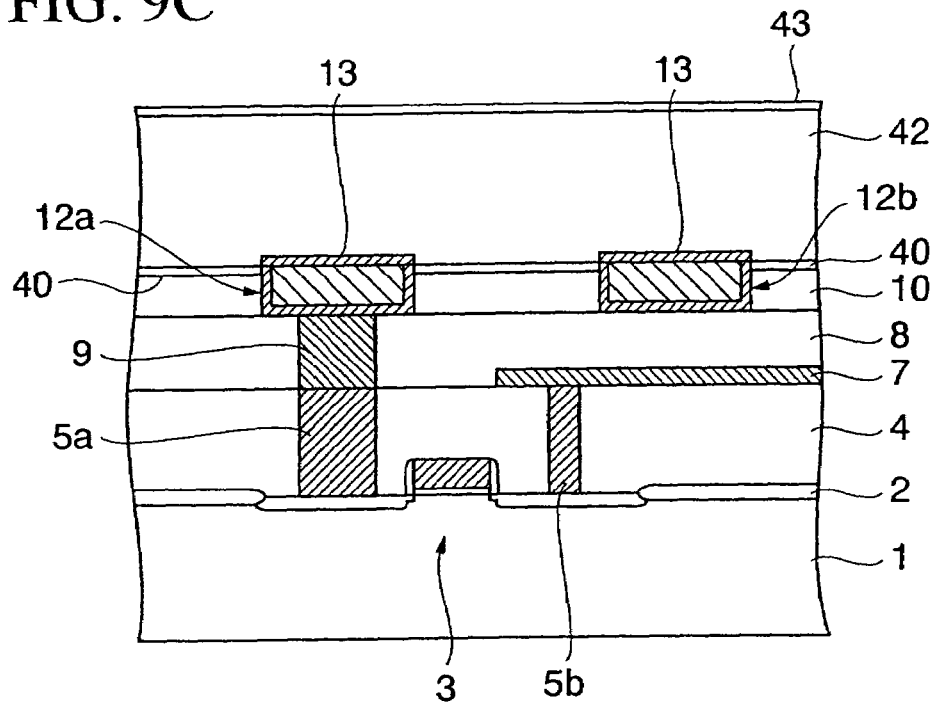

Then, as shown in FIG. 9B, the first cap layer 13 is etched by the selective etching such that such first cap layer 13 is removed from the upper surface of the third interlayer insulating film 10 but left on the first and second copper wirings 12a, 12b. Such selective etching is carried out under following conditions, for example.

Although depending on the CVD conditions such as the growth temperature, the gas flow rate, the addition amount of ammonia, etc., the film density of the ZrN layer is largely different in the metal phase (the low resistance layer 13a) on the metal film and the insulating phase (the high resistance layer 13b) on the insulating film. That is, in the ZrN layer, typically the film density of the insulating phase is 5.0 to 5.5 g/cm$^3$ while the film density of the metal phase is 6.0 to 6.6 g/cm$^3$. Accordingly, since the etching rate of the ZrN layer according to various etchants depends on the film density, the ZrN insulating phase can be removed selectively by utilizing this nature. If the aqueous solution such as hydrofluoric acid, hydrochloric acid, sulfuric acid, etc. or the chemicals such as hydrogen peroxide, etc. as the etchant is appropriately heated, the desired etching rate against the ZrN film can be obtained.

For example, the etching rate of the metal phase ZrN by the hydrofluoric acid at the temperature of 25° C. is 40 nm/min whereas the etching rate of the insulating phase ZrN is 53 nm/min. Therefore, as shown in FIG. 9A, if the first cap layer 13 having a thickness of 40 nm and made of ZrN is formed on the first and second copper wirings 12a, 12b and the third interlayer insulating film 10 and then the hydrofluoric acid of the concentration 1 wt % is supplied to the first cap layer 13 for 45 seconds, the first cap layer 13 of 10 nm thickness can be left only on the first and second copper wirings 12a, 12b, as shown in FIG. 9B.

As the etching equipment for etching the ZrN, the batch type etching equipment or the sheet-fed type etching equipment may be employed. However, it is preferable that, in order to etch the first cap layer 13 for a short time with good uniformity, the sheet-fed type etching equipment should be employed.

After the first cap layer 13 is etched by the selective etching as described above, as shown in FIG. 9C, the fourth interlayer insulating film 42 that has a thickness of 600 nm and is made of SiO$_2$ and the second stopper layer 43 that has a thickness of 50 nm are formed sequentially on the first cap layer 13 and the first stopper layer 40 by the CVD method.

Figure 9D:
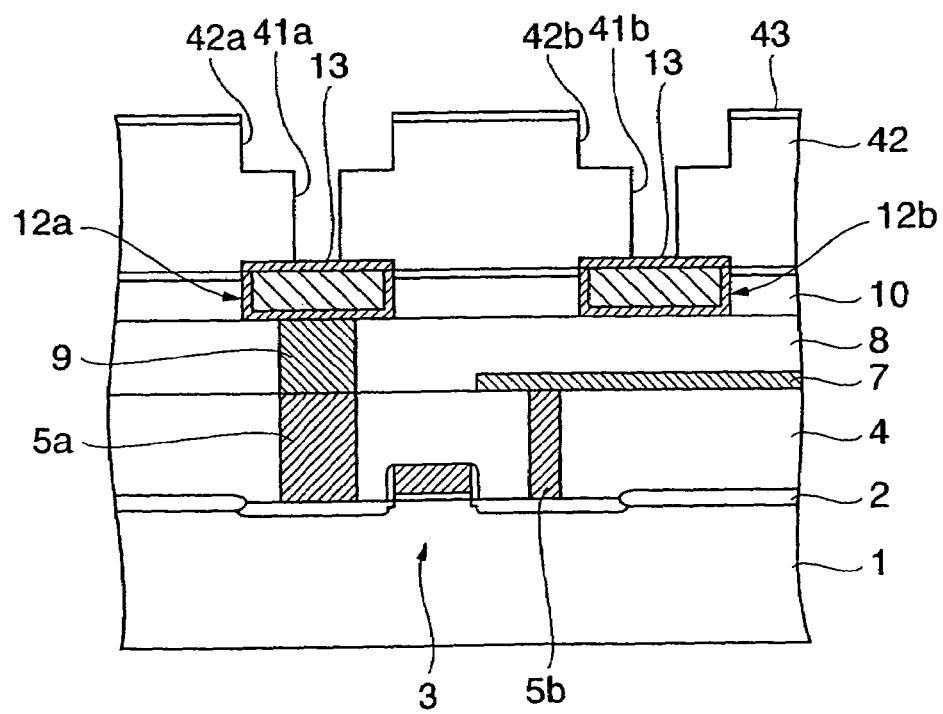

Then, as shown in FIG. 9D, the second stopper layer 43 and the fourth interlayer insulating film 42 are patterned. Thus, the first and second via holes 41a, 41b to expose the first cap layer 13 are formed in the second stopper layer 43, the fourth interlayer insulating film 42, and the second cap layer 41, and also the third and fourth wiring trenches 42a, 42b a part of which overlaps with the first and second via holes 41a, 41b respectively are formed in the second stopper layer 43 and the fourth interlayer insulating film 42. Accordingly, the first cap layer 13 is exposed through the first and second via holes 41a, 41b.

Figure 9E:
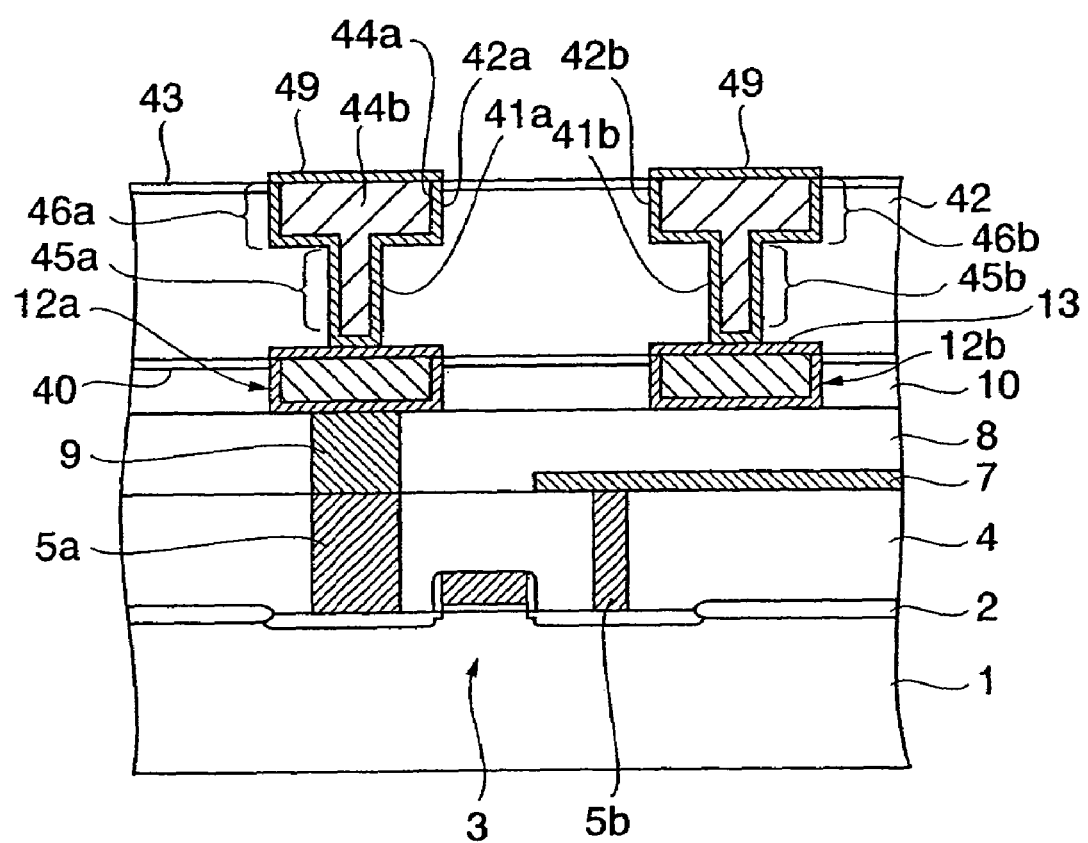

Next, steps required to form the structure shown in FIG. 9E will be explained hereunder.

Like the second embodiment, the barrier metal layer 44a is formed on the inner peripheral surfaces and the bottom surfaces of the first and second via holes 41a, 41b and the third and fourth wiring trenches 42a, 42b and on the upper surface of the second stopper layer 43 respectively. In addition, the copper seed layer (not shown) is formed on the barrier metal layer 44a to have a thickness of 30 to 100 nm.

The barrier metal layer 44a is formed by the sputter method, and is constructed any one of Ta, TaN, and their laminated film, or TiN, for example. Also, the copper seed layer is formed by the sputter method to have a thickness of 30 to 100 nm.

Then, the copper layer 44b is formed on the copper seed layer by the electrolytic plating method. Thus, the third and fourth wiring trenches 42a, 42b and the first and second via holes 41a, 41b are buried perfectly. In this case, the copper seed layer is formed integrally with the copper layer 44b.

In addition, the copper layer 44b and the barrier metal layer 44a are moved from the upper surface of the second stopper layer 43 by the CMP method while using the second stopper layer 43 as the polishing stopper. Thus, the copper layer 44b and the barrier metal layer 44a left in the first and second via holes 41a, 41b respectively are employed as first and second vias 45a, 45b, while the copper layer 44b and the barrier metal layer 44a left in the third and fourth wiring trenches 42a, 42b respectively are employed as third and fourth copper wirings 46a, 46b.

The third copper wiring 21a is connected electrically to the first copper wiring 12a via the first via 20a and the cap layer 13. Also, the fourth copper wiring 21b is connected electrically to the second copper wiring 12b via the second via 20b and the cap layer 13.

After this, a second cap layer 49 made of the same material as the first cap layer 13 is formed on the third and fourth copper wirings 46a, 46b and the second stopper layer 43. Then, like the first cap layer 13, the second cap layer 49 is selectively etched to leave only on the third and fourth copper wirings 46a, 46b.

In addition, the copper wiring having the multi-layered structure is formed on the second interlayer insulating film 8 by repeating the same formations of the interlayer insulating films, the copper wirings, and the vias as described above.

In the semiconductor device formed according to above steps, the ZrN cap layers 13, 45 left on the copper wirings 12a, 12b, 46a, 47b can prevent the oxidation of the copper wirings 12a, 12b, 46a, 47b.

Also, since the ZrN cap layer formed on the third interlayer insulating film is removed, the limitation to the film thickness of the ZrN cap layer can be eliminated. Since the resistance value characteristic of the ZrN cap layer on the insulating film is changed abruptly around the film thickness of 20 nm, it is difficult to control the film thickness. However, if the selective etching of the ZrN cap layer according to the present embodiment is carried out, there is no possibility that the ZrN cap layer never acts as the low resistance layer on the insulating film.

The ZrN cap layer can be removed from the upper surface of the third interlayer insulating film by executing selectively the etching without the mask such as the resist, etc. with good precision. Therefore, the formation and the alignment of the resist patterns are not needed, and thus the throughput is never largely lowered.

(Fourth Embodiment)

In the third embodiment, the ZrN cap layer is removed selectively from the insulating cap layer. In this case, it is possible that, if the copper in the copper wiring reacts with ZrN in the cap layer, the copper is diffused into the interlayer insulating film through the cap layer.

For this reason, like the second embodiment, the copper diffusion from the copper wiring to the interlayer insulating film may be prevented surely by covering the ZrN layer left on the copper wirings with the insulating cap layer. The structure and the steps of forming the same will be explained hereunder.

First, in compliance with the steps shown in FIGS. 6A to 6F, the MOS transistor 3 is formed on the silicon substrate 1, then the interlayer insulating films 4, 8, 10, then the first stopper layer is formed, the wiring 7 is formed, then the conductive plugs 5a, 5b, 9 are formed, and then the first and second copper wirings 12a, 12b are formed. Then, as shown in FIG. 9A, the first cap layer 13 made of ZrN is formed on the first and second copper wirings 12a, 12b and the first stopper layer 40. The film thickness of the first cap layer 13 is not limited to 20 nm or less, and the first cap layer 13 is formed to have a thickness of 40 nm, for example.

Figure 10A:
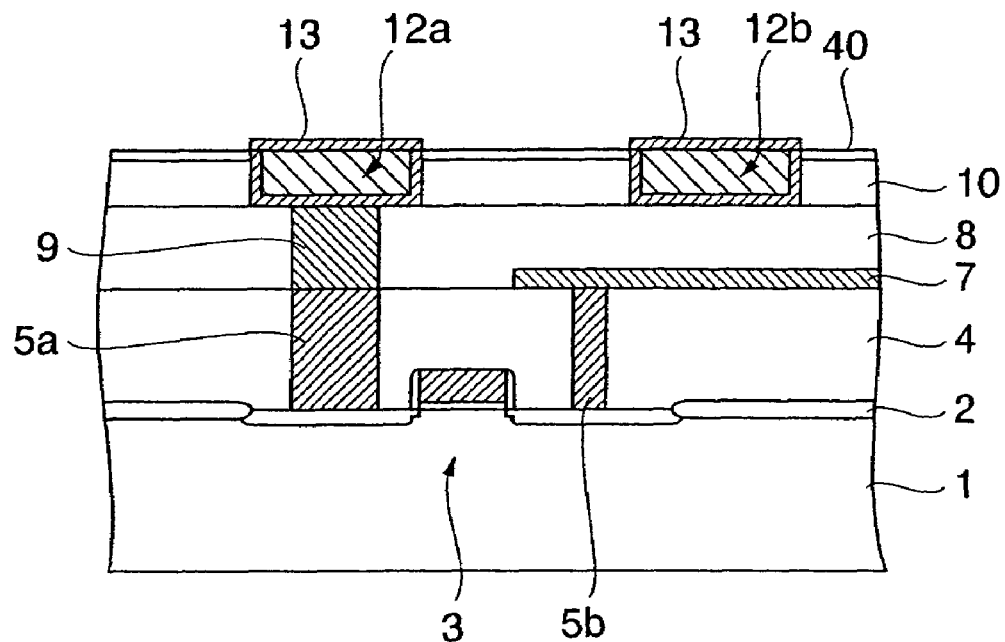
FIGS. 10A to 10E are sectional views showing a semiconductor device manufacturing method according to a fourth embodiment of the present invention.

Then, as shown in FIG. 10A, the first cap layer 13 is etched by the selective etching to remove from the upper surface of the third interlayer insulating film 10 and to leave on the first and second copper wirings 12a, 12b. The selective etching of the first cap layer 13 is carried out by the method shown in the third embodiment.

Figure 10B:
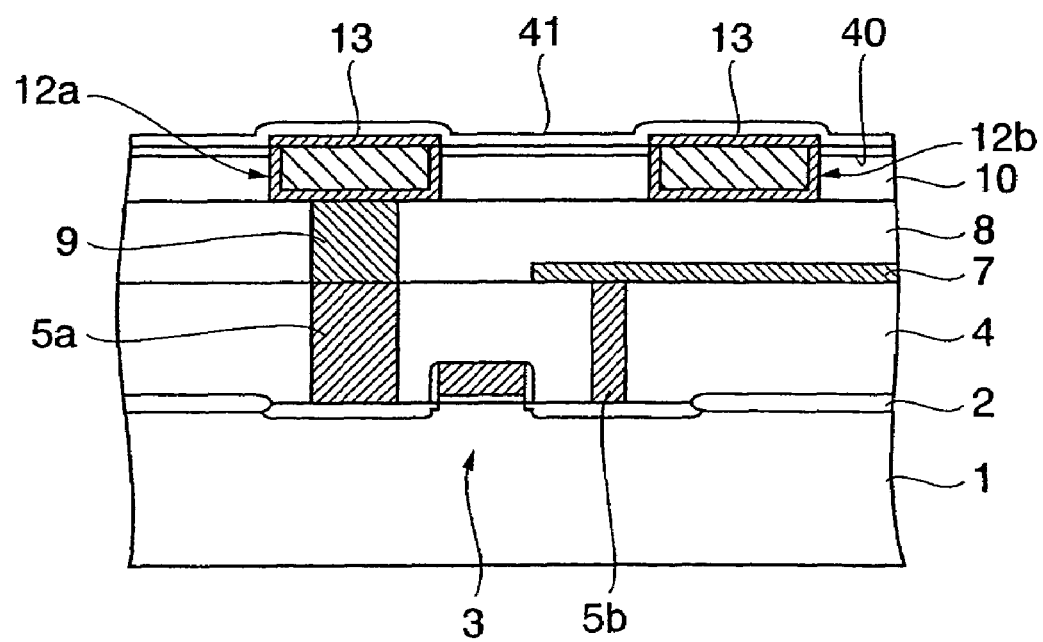

Then, as shown in FIG. 10B, the insulating second cap layer 41 having the copper diffusion preventing function is formed on the first cap layer 13. As the second cap layer 41, the insulating layer containing SiC, SiN as the base element or the insulating layer containing SiCO, SiON as the base element is formed by the PE-CVD method to have a thickness of 20 to 100 nm. The second cap layer 41 is formed in accordance with the method explained in the second embodiment.

Figure 10C:
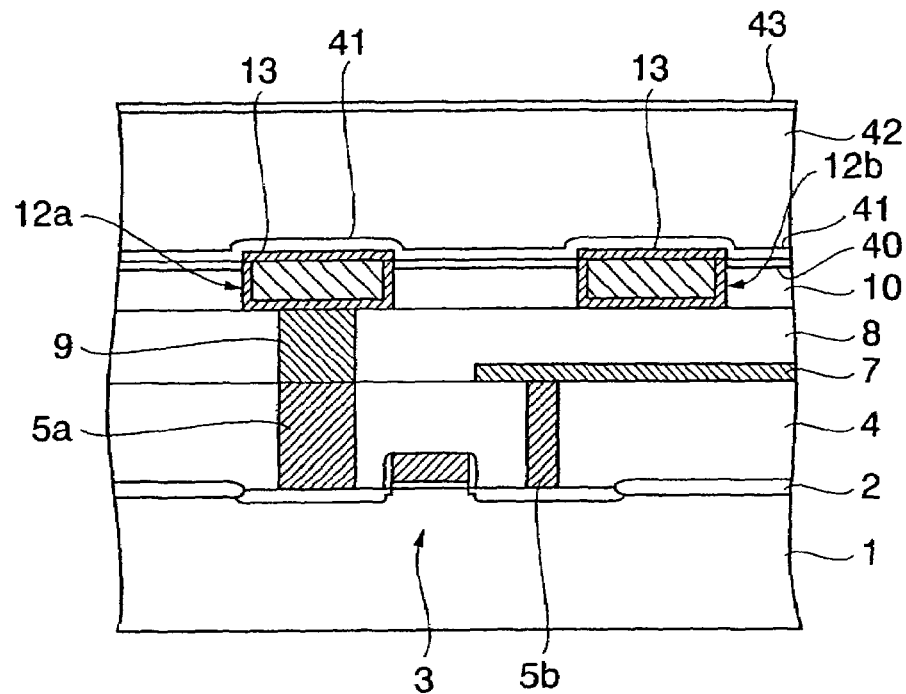

Then, as shown in FIG. 10C, the fourth interlayer insulating film 42 having a thickness of 600 nm and made of $SiO_2$ and the 'second stopper layer 43 of 50 nm thickness are formed sequentially on the second cap layer 41 by the CVD method.

Figure 10D:
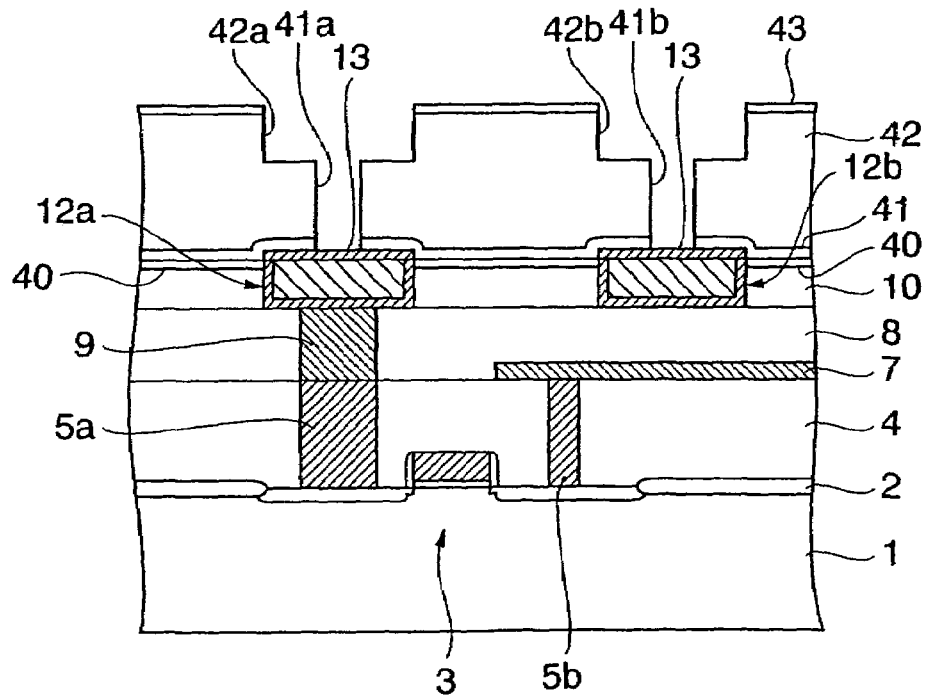

Then, as shown in FIG. 10D, the second stopper layer 43, the fourth interlayer insulating film 42, and the second cap layer 41 are patterned. Thus, the first and second via holes 41a, 41b to expose the first cap layer 13 are formed in the second stopper layer 43, the fourth interlayer insulating film 42, and the second cap layer 41, and also the third and fourth wiring trenches 42a, 42b that overlap with the first and second via holes 41a, 41b respectively are formed in the second stopper layer 43 and the fourth interlayer insulating film 42.

Figure 10E:
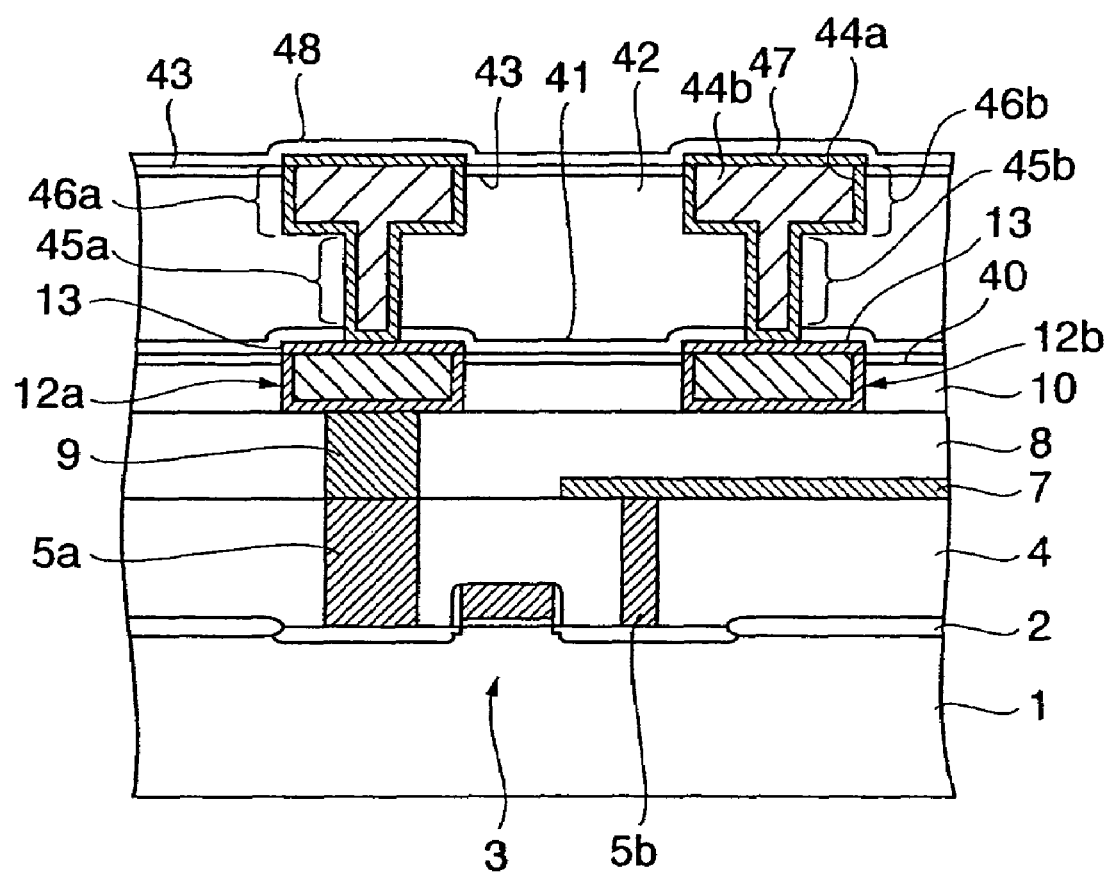

Next, steps required to form the structure shown in FIG. 10E will be explained hereunder.

Like the second embodiment, the barrier metal layer 44a is formed on the inner peripheral surfaces and the bottom surfaces of the first and second via holes 41a, 41b and the third and fourth wiring trenches 42a, 42b and on the upper surface of the second stopper layer 43 respectively. The barrier metal layer 44a is formed by the sputter method and is made of any one of Ta, TaN, and their laminated film or TiN, for example.

Then, the copper seed layer (not shown) of 30 to 100 nm thickness is formed on the barrier metal layer 44a by the sputter method.

In addition, the copper layer 44b is formed on the copper seed layer by the electrolytic plating method, whereby the third and fourth wiring trenches 42a, 42b and the first and second via holes 41a, 41b are completely buried. In this case, the copper seed layer is formed integrally with the copper layer 44b.

Then, the copper layer 44b and the barrier metal layer 44a are removed from the upper surface of the second stopper layer 43 by the CMP method while using the second stopper layer 43 as the polishing stopper. As a result, the copper layer 44b and the barrier metal layer 44a left in the first and second via holes 41a, 41b respectively are used as the first and second vias 45a, 45b, and also the copper layer 44b and the barrier metal layer 44a left in the third and fourth wiring trenches 42a, 42b respectively are used as the third and fourth copper wirings 46a, 46b.

The third copper wiring 21a is connected electrically to the first copper wiring 12a via the first via 20a and the first cap layer 13. Also, the fourth copper wiring 21b is connected electrically to the second copper wiring 12b via the second via 20b and the first cap layer 13.

Then, the third cap layer 47 made of ZrN is formed on the third and fourth copper wirings 46a, 46b and the second stopper layer 43. In addition, the third cap layer 47 is selectively etched to leave only on the third and fourth copper wirings 46a, 46b.

Then, the fourth cap layer 48 made of the same material as the second cap layer 41 is left on the third cap layer 47 and the second stopper layer 43.

Then, as described above, the copper wiring having the multi-layered structure is formed on the second interlayer insulating film 8 by repeating the formations of the interlayer insulating films, the copper wirings, and the vias.

In the semiconductor device formed according to above steps, the ZrN cap layers 13, 47 left only on the copper wirings 12a, 12b, 46a, 46b are covered with another cap layers 40, 48 made of the copper diffusion preventing insulating material. Therefore, it can be prevented that the copper is diffused from the copper wirings 12a, 12b, 46a, 46b to the interlayer insulating film via the ZrN cap layers 13, 47. In addition, since the ZrN cap layers 13, 47 are removed selectively from the upper surface of the interlayer insulating film, the copper wirings are never short-circuited even if the film thickness is thicker than 20 nm.

(Other Embodiment)

In the above embodiments, the interlayer insulating film is formed of $SiO_2$. But the interlayer insulating film may be formed of the low-dielectric constant insulating material. Since the influence of the wiring delay becomes aggravated with the miniaturization of the element, the application of the low-dielectric constant insulating material becomes important much more. As the low-dielectric constant insulating material, the organic polymer, the silicon oxide that is impregnated with the carbon, or the porous low-dielectric constant insulating material can be listed as the typical material.

As the method of forming the low-dielectric constant insulating material, the spin-on process of coating uniformly the liquid low-dielectric constant insulating material onto the substrate while rotating the substrate or the PE-CVD method is the representative method. If the porous low-dielectric constant insulating film is formed by the coating process, a hollow body is formed by executing the thermolysis of unstable components and the formation of the mold intermediate structure and the thermolysis of the mold by employing the hydrolysis and the condensation polymerization by virtue of the sol-gel method, and thus the annealing process at about 400° C. is needed.

Also, in the above embodiments, as the pre-step of burying the copper in the wiring trenches and the via holes, the barrier metal layer and the copper seed layer are formed by the sputter. But these layers may be formed by the CVD method. For example, if the titanium nitride is formed as the barrier metal by the CVD method, TDEAT and the ammonia are used as the reaction gas. In addition, the copper seed layer may be formed by the CVD method. As the growth gas for the copper seed layer, Cu(hfac)TMVS is employed as the material, for example.

As the method of forming the copper seed layer, the self ionizing plasma method which can give the good coverage to fine via holes, etc. may be employed.

In the above embodiments, the dual damascene method having the step of burying simultaneously the barrier metal and the copper in the via holes and the wiring trenches is explained. However, the formation of the via and the copper wiring is not limited to the dual damascene method. The damascene method by which the barrier metal and the copper are buried in the via holes, then the wiring trenches are formed, and then the barrier metal and the copper are buried again in the wiring trenches may be employed. In this case, the cap layer made of the zirconium, the titanium, the hafnium, the zirconium nitride, or any one of their compounds may also be formed on the copper vias and the copper wirings.

As described above, according to the present invention, the first cap layer made of the substance, the portion of which formed on the copper film has the smaller electrical resistance value than the portion formed on the insulating film, is formed on the first insulating film and the first metal pattern. Therefore, if the holes or the trenches are formed on the first metal pattern by patterning the second insulating film formed on the first insulating film, the first metal pattern can be protected by the first cap layer and thus the oxidation, the corrosion, and the contamination of the first metal pattern can be prevented. In addition, since the second metal pattern buried in the holes and the trenches is connected electrically to the first metal pattern through the first cap layer, the electrical conduction between the second metal pattern and first metal pattern can be assured.

Also, since the first cap layer acts as the insulating portion on the first insulating film, the patterning of the first cap layer can be omitted, which can contribute the reduction of the steps. In this case, since the first cap layer made of the zirconium nitride, or the like can be formed while changing the film density on the first insulating film and on the first metal pattern, such first cap layer can be removed selectively from the upper surface of the insulating film by the selective etching without the mask. As a result, the patterning step can be simplified.

In addition, the second cap layer made of the copper diffusion preventing insulating material is formed on the cap layer. Therefore, even if the first metal pattern contains the copper, the copper diffusion from the first metal pattern to the interlayer insulating film can be prevented without fail.

What is claimed is:

1. A manufacturing method of a semiconductor device comprising the steps of:
    forming a first insulating film over a semiconductor substrate;
    forming a first trench or a first hole in the first insulating film;
    forming a first metal pattern by burying a copper in the first trench or the first hole; and
    forming a first cap layer on the first metal pattern and the first insulating film, a first portion of the cap layer on the first metal pattern having a smaller electrical resistance than a second portion of the cap layer on the first insulating film,
    wherein the first portion of the cap layer on the first metal pattern acts as the conductive film and the second portion of the cap layer on the first insulating film acts as the insulating film.

2. A manufacturing method of a semiconductor device according to claim 1, wherein the first cap layer comprises zirconium, hafnium, zirconium nitride, or any one of their metal compounds.

3. A manufacturing method of a semiconductor device according to claim 1, wherein the first cap layer is formed to have a thickness of less than 20 nm.

4. A manufacturing method of a semiconductor device according to claim 1, wherein an annealing is applied after the first cap layer is formed.

5. A device manufacturing method of a semiconductor device according to claim 1, wherein the first cap layer is alloyed with the first metal pattern after the first cap layer is formed.

6. A manufacturing method of a semiconductor device according to claim 1, further comprising the steps of:
forming a second insulating film on the first cap layer;
forming a second trench or a second hole in the second insulating film over the first metal pattern; and
forming a second metal pattern that is connected electrically to the first metal pattern via the first cap layer by burying a copper in the second trench or the second hole.

7. A manufacturing method of a semiconductor device according to claim 6, further comprising the step of:
forming a barrier metal layer between the second metal pattern and the first cap layer.

8. A manufacturing method of a semiconductor device according to claim 7, wherein the barrier metal layer is formed of refractory metallic nitride.

9. A manufacturing method of a semiconductor device according to claim 1, further comprising the step of:
forming a second cap layer that is made of copper diffusion preventing insulating material, that is different from the first cap layer, on the first cap layer.

10. A manufacturing method of a semiconductor device according to claim 9, wherein an insulating film that contains silicon carbide and silicon nitride as base elements or an insulating film that contains silicon oxide carbide and silicon oxide nitride as base elements is formed as the second cap layer.

11. A manufacturing method of a semiconductor device according to claim 1, wherein a formation of the first metal pattern is a formation of a copper pattern.

12. A manufacturing method of a semiconductor device comprising the steps of:
forming a first insulating film over a semiconductor substrate;
forming a first trench or a first hole in the first insulating film;
forming a first metal pattern by burning a copper in the first trench or the first hole;
forming a first cap layer on the first metal pattern and the first insulating film, a first portion of the cap layer on the first metal pattern having a larger film density than a second portion of the cap layer on the first insulating film; and
removing the first cap layer from an upper surface of the first insulating film without a mask, but leaving the first cap layer on the first metal pattern.

13. A manufacturing method of a semiconductor device according to claim 12, wherein the first cap layer comprises zirconium, hafnium, zirconium nitride or any one of their metal compounds.

14. A manufacturing method of a semiconductor device according to claim 12, further comprising the step of:
forming a second cap layer that is made of copper diffusion preventing insulating material, that is different from the first cap layer, on the first cap layer.

* * * * *